(12) United States Patent
Song et al.

(10) Patent No.: US 11,837,615 B2
(45) Date of Patent: Dec. 5, 2023

(54) IMAGE SENSOR WITH INCREASED GATE PATTERN WIDTH

(71) Applicant: Samsung Electronics Co., Ltd., Suwon-si (KR)

(72) Inventors: Taeyoung Song, Hwaseong-si (KR); Sung In Kim, Hwaseong-si (KR); Kwansik Cho, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 285 days.

(21) Appl. No.: 17/314,910

(22) Filed: May 7, 2021

(65) Prior Publication Data

US 2022/0085085 A1    Mar. 17, 2022

(30) Foreign Application Priority Data

Sep. 11, 2020  (KR) .................. 10-2020-0116847

(51) Int. Cl.
*H01L 27/146*  (2006.01)
*H01L 23/00*  (2006.01)

(52) U.S. Cl.
CPC ........ *H01L 27/14614* (2013.01); *H01L 24/08* (2013.01); *H01L 27/1462* (2013.01);
(Continued)

(58) Field of Classification Search
CPC ............... H01L 27/14614; H01L 24/08; H01L 27/14621; H01L 27/14623; H01L 27/1463; H01L 27/14634; H01L 27/14636; H01L 27/1464; H01L 27/14645; H01L 27/14689; H01L 2224/08145; H01L 27/14603; H01L 27/14638; H01L 27/14641; H01L 21/28518; H01L 21/76877
(Continued)

(56) References Cited

U.S. PATENT DOCUMENTS 7,335,930 B2    2/2008  Furukawa et al.
7,524,751 B2    4/2009  Ryu
(Continued)

FOREIGN PATENT DOCUMENTS

KR        100242434 B1    3/2000
KR        100357195 B1    10/2002
(Continued)

*Primary Examiner* — Kimberly N Rizkallah
*Assistant Examiner* — Pratiksha Jayant Lohakare
(74) *Attorney, Agent, or Firm* — Muir Patent Law, PLLC

(57) ABSTRACT

An image sensor may include a substrate having first and second surfaces opposite to each other and including unit pixel regions and impurity regions near the first surface, a device isolation pattern provided on the first surface to define the impurity regions, and an interconnection layer including an insulating layer covering the first surface of the substrate, interconnection lines on the insulating layer, and a penetration structure penetrating the insulating layer. The penetration structure may include a first pattern connected to one of the impurity regions and in contact with at least a portion of the device isolation pattern, a second pattern provided on the first pattern and in contact with the interconnection lines, and a third pattern provided between the first and second patterns. A top surface of the first pattern may be higher than that of the device isolation pattern.

20 Claims, 20 Drawing Sheets

(52) U.S. Cl.
CPC ...... *H01L 27/1463* (2013.01); *H01L 27/1464* (2013.01); *H01L 27/14621* (2013.01); *H01L 27/14623* (2013.01); *H01L 27/14627* (2013.01); *H01L 27/14634* (2013.01); *H01L 27/14636* (2013.01); *H01L 27/14645* (2013.01); *H01L 27/14689* (2013.01); *H01L 2224/08145* (2013.01)

(58) Field of Classification Search
USPC ........................................................ 257/292
See application file for complete search history.

(56) References Cited

U.S. PATENT DOCUMENTS

| | | | |
|---|---|---|---|
| 9,570,506 B2* | 2/2017 | Endo | H01L 27/14643 |
| 9,865,736 B2 | 1/2018 | Chang et al. | |
| 9,887,211 B2 | 2/2018 | Yamamoto | |
| 9,893,114 B2* | 2/2018 | Endo | H01L 27/14685 |
| 10,462,405 B2* | 10/2019 | Shimotsusa | H01L 27/14683 |
| 10,553,637 B2* | 2/2020 | Itonaga | H01L 27/14634 |
| 10,559,685 B2 | 2/2020 | Li et al. | |
| 10,957,724 B2* | 3/2021 | Hynecek | G01S 7/4816 |
| 2003/0006441 A1* | 1/2003 | Nakamura | H01L 21/76877 |
| | | | 257/E21.585 |
| 2006/0208289 A1* | 9/2006 | Ohkawa | H01L 27/14643 |
| | | | 257/E27.131 |
| 2012/0168813 A1* | 7/2012 | Chen | G01K 7/183 |
| | | | 257/E33.062 |
| 2012/0199894 A1* | 8/2012 | Furuya | H01L 27/14612 |
| | | | 257/292 |
| 2013/0049156 A1* | 2/2013 | Furukawa | H01L 27/1463 |
| | | | 257/443 |
| 2014/0077271 A1* | 3/2014 | Fujii | H01L 31/18 |
| | | | 438/59 |
| 2016/0190188 A1* | 6/2016 | Murakami | H01L 27/14665 |
| | | | 250/214 A |
| 2018/0240847 A1* | 8/2018 | Ota | H01L 27/14665 |
| 2018/0358393 A1* | 12/2018 | Sato | H01L 27/14687 |
| 2019/0355781 A1* | 11/2019 | Qi | H01L 27/14612 |

FOREIGN PATENT DOCUMENTS

| | | |
|---|---|---|
| KR | 100414306 B1 | 3/2004 |
| KR | 100629961 B1 | 9/2006 |

* cited by examiner

IMAGE SENSOR WITH INCREASED GATE PATTERN WIDTH

CROSS-REFERENCE TO RELATED APPLICATIONS

This U.S. non-provisional patent application claims priority under 35 U.S.C. § 119 to Korean Patent Application No. 10-2020-0116847, filed on Sep. 11, 2020, in the Korean Intellectual Property Office, the entire contents of which are hereby incorporated by reference.

BACKGROUND OF THE INVENTION

The present disclosure relates to an image sensor, and in particular, to a complementary metal-oxide-semiconductor (CMOS) image sensor.

An image sensor is a device that converts optical signals into electrical signals. With the recent development of the computer and communication industries, there is an increasing demand for high-performance image sensors in a variety of applications such as digital cameras, camcorders, personal communication systems, gaming machines, security cameras, micro-cameras for medical applications, and/or robots.

The image sensors are generally classified into charge-coupled device (CCD) and complementary metal-oxide semiconductor (CMOS) image sensors. Since the CMOS image sensor can be operated by a simple operation method and signal-processing circuits of the CMOS image sensor can be integrated on a single chip, a size of an electronic product including the CMOS image sensor can be reduced. In addition, since the CMOS image sensor has a relatively low power consumption, it is easily applicable to an electronic device with a limited battery capacity. Furthermore, the CMOS image sensor can be fabricated using CMOS fabrication techniques, and thus, it is possible to reduce a manufacturing cost thereof. Moreover, as high-resolution CMOS image sensors are realized, the use of CMOS image sensors is rapidly increasing.

SUMMARY

An embodiment of the inventive concept provides an image sensor with improved electric characteristics.

According to an embodiment of the inventive concept, an image sensor may include a first substrate having a first surface and a second surface, which are opposite to each other, the first substrate including unit pixel regions and impurity regions, the impurity regions being adjacent to the first surface, a device isolation pattern provided on the first surface of the first substrate to define the impurity regions, and a first interconnection layer covering the first surface of the first substrate, the first interconnection layer including a first insulating layer covering the first surface of the first substrate, interconnection lines on the first insulating layer, and a first penetration structure penetrating the first insulating layer. The first penetration structure may include a first pattern, which is connected to one of the impurity regions of the first substrate and is in contact with at least a portion of the device isolation pattern, a second pattern, which is provided on the first pattern and is in contact with the interconnection lines, and a third pattern provided between the first pattern and the second pattern. A top surface of the first pattern may be provided at a level higher than a top surface of the device isolation pattern.

According to an embodiment of the inventive concept, an image sensor may include a first substrate having a first surface and a second surface, which are opposite to each other, the first substrate including unit pixel regions and impurity regions, the impurity regions being adjacent to the first surface, a device isolation pattern provided on the first surface of the first substrate to define the impurity regions, and a first interconnection layer covering the first surface of the first substrate, the first interconnection layer including a first insulating layer covering the first surface of the first substrate, interconnection lines on the first insulating layer, and a first penetration structure penetrating the first insulating layer. The first penetration structure may include a first pattern, which is connected to one of the impurity regions of the first substrate and is vertically overlapped with at least a portion of the device isolation pattern, a second pattern in contact with the interconnection lines, and a third pattern covering a top surface of the first pattern. The first pattern and the second pattern may be vertically spaced apart from each other, with the third pattern interposed therebetween.

According to an embodiment of the inventive concept, an image sensor may include a first substrate having a first surface and a second surface, which are opposite to each other, the first substrate including a pixel array region, an optical black region, and a pad region, the pixel array region including unit pixel regions and impurity regions, the impurity regions being adjacent to the first surface, a device isolation pattern provided on the first surface of the first substrate to define the impurity regions, a pixel isolation pattern provided in the first substrate to define the unit pixel regions, gate patterns provided on the first surface of the first substrate, an anti-reflection layer provided on the second surface of the first substrate, color filters and micro lenses provided on the anti-reflection layer, a grid pattern provided between the color filters, and a first interconnection layer covering the first surface of the first substrate and the gate patterns, the first interconnection layer including a first insulating layer covering the first surface of the first substrate, interconnection lines on the first insulating layer, and a first penetration structure and a second penetration structure penetrating the first insulating layer. The first penetration structure may include a first pattern connected to one of the impurity regions of the first substrate and in contact with at least a portion of the device isolation pattern, a second pattern provided on the first pattern and in contact with the interconnection lines, and a third pattern provided between the first pattern and the second pattern. A top surface of the first pattern may be provided at a level higher than a top surface of the device isolation pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
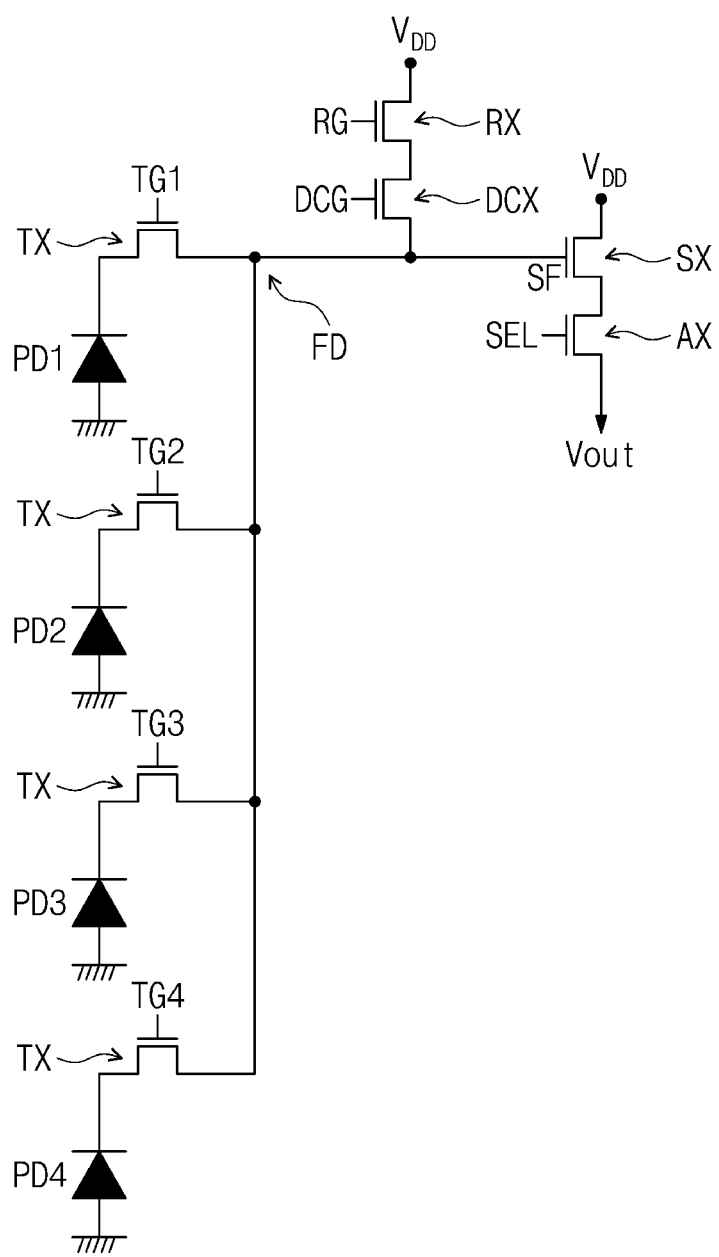
FIG. 1 is a circuit diagram illustrating an image sensor according to an embodiment of the inventive concept.

FIG. 1 is a circuit diagram illustrating an image sensor according to an embodiment of the inventive concept.

Referring to FIG. 1, unit pixel regions of an image sensor may include photoelectric conversion regions PD1, PD2, PD3, and PD4, transfer transistors TX, a source follower transistor SX, a reset transistor RX, a dual conversion transistor DCX, and a selection transistor AX. The transfer transistor TX, the source follower transistor SX, the reset transistor RX, the dual conversion transistor DCX, and the selection transistor AX may include a transfer gate TG, a source follower gate SF, a reset gate RG, a dual conversion gate DCG, and a selection gate SEL, respectively.

Each of the photoelectric conversion regions PD1, PD2, PD3, and PD4 may be a photodiode including an n-type impurity region and a p-type impurity region. A floating diffusion region FD may serve as drains of the transfer transistors TX. The floating diffusion region FD may serve as a source of the dual conversion transistor DCX. The floating diffusion region FD may connect the source follower transistor SX electrically to the source follower gate SF. The source follower transistor SX may be connected to the selection transistor AX.

Hereinafter, an operation of the image sensor will be described with reference to FIG. 1. First, a power voltage VDD may be applied to the drain of the reset transistor RX and a drain of the source follower transistor SX in a light-blocking state, and then the reset transistor RX and the dual conversion transistor DCX may be turned on to discharge electric charges from the floating diffusion region FD. Thereafter, electron-hole pairs may be produced in the photoelectric conversion regions PD1, PD2, PD3, and PD4 by turning the reset transistor RX off and entering an external light into the photoelectric conversion regions PD1, PD2, PD3, and PD4. Holes may be moved to and accumulated in the p-type impurity regions of the photoelectric conversion regions PD1, PD2, PD3, and PD4, whereas electrons may be moved to and accumulated in the n-type impurity regions. If the transfer transistors TX is turned on, the electric charges, such as the electrons and holes, may be transferred to and accumulated in the floating diffusion region FD. A change in the accumulated charge amount may lead to a change in gate bias of the source follower transistor SX and consequently a change in source potential of the source follower transistor SX. In this case, if the selection transistor AX is turned on, an amount of the electric charges may be read out as a signal to be transmitted through a column line.

An interconnection line may be electrically connected to at least one of the transfer gate TG, the source follower gate SF, the dual conversion gate DCG, the reset gate RG, and the selection gate SEL. The interconnection line may be configured to apply the power voltage VDD to the drain of the reset transistor RX or the drain of the source follower transistor SX. The interconnection line may include a column line connected to the selection transistor AX. The interconnection line may be interconnection lines, which will be described below.

FIG. 1 illustrates an example, in which a single floating diffusion region FD is electrically shared by the photoelectric conversion regions PD1, PD2, PD3, and PD4, but the inventive concept is not limited to this example. For example, one unit pixel region may be configured to include one of the photoelectric conversion regions PD1, PD2, PD3, and PD4, the floating diffusion region FD, and four transistors TX RX, AX, and SX, and here, the reset, source follower, or selection transistor RX, SX, or AX may be shared by neighboring unit pixel regions. In this case, an integration density of the image sensor may be increased.

Figure 2:
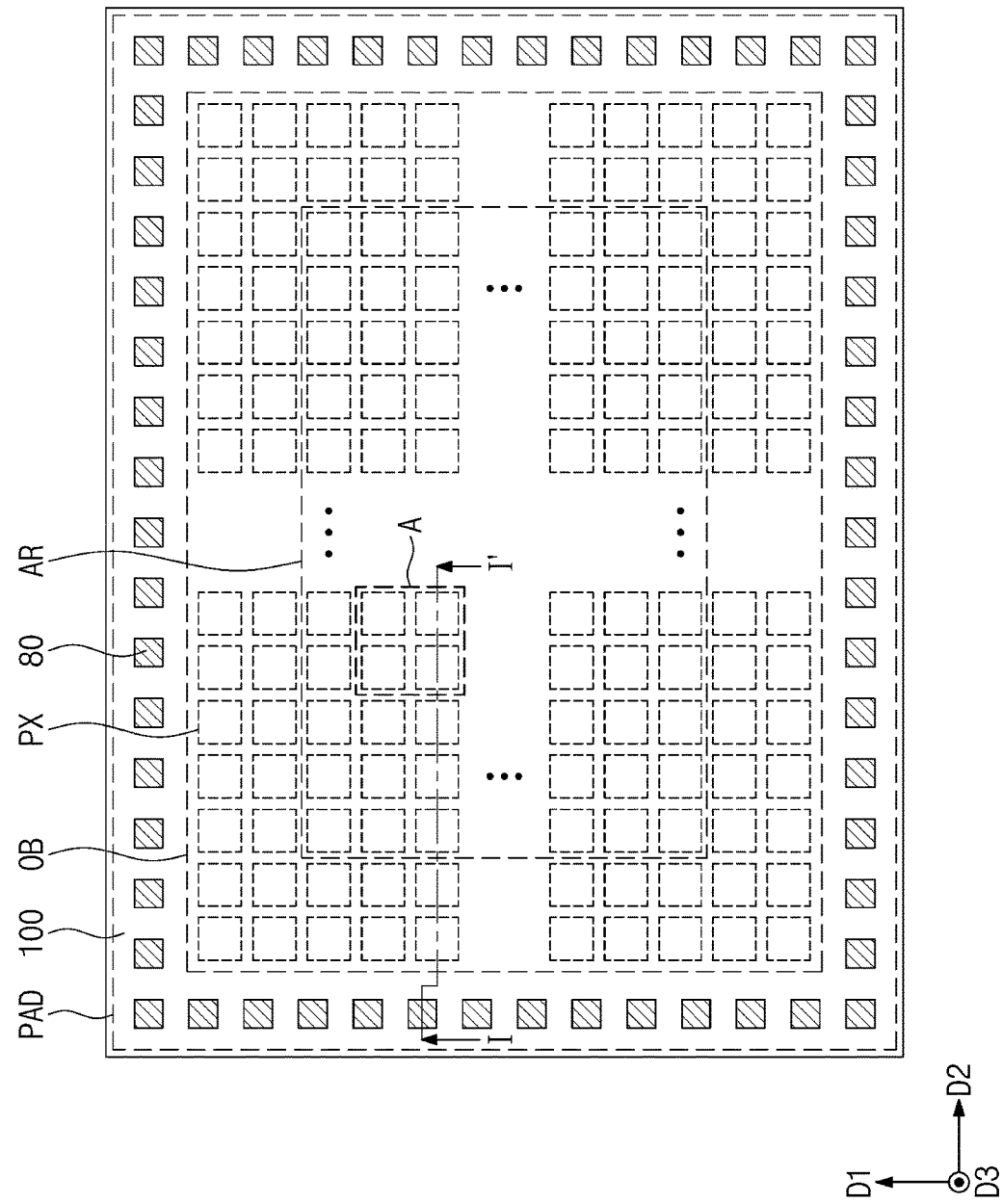
FIG. 2 is a plan view illustrating an image sensor according to an embodiment of the inventive concept.
Figure 3:
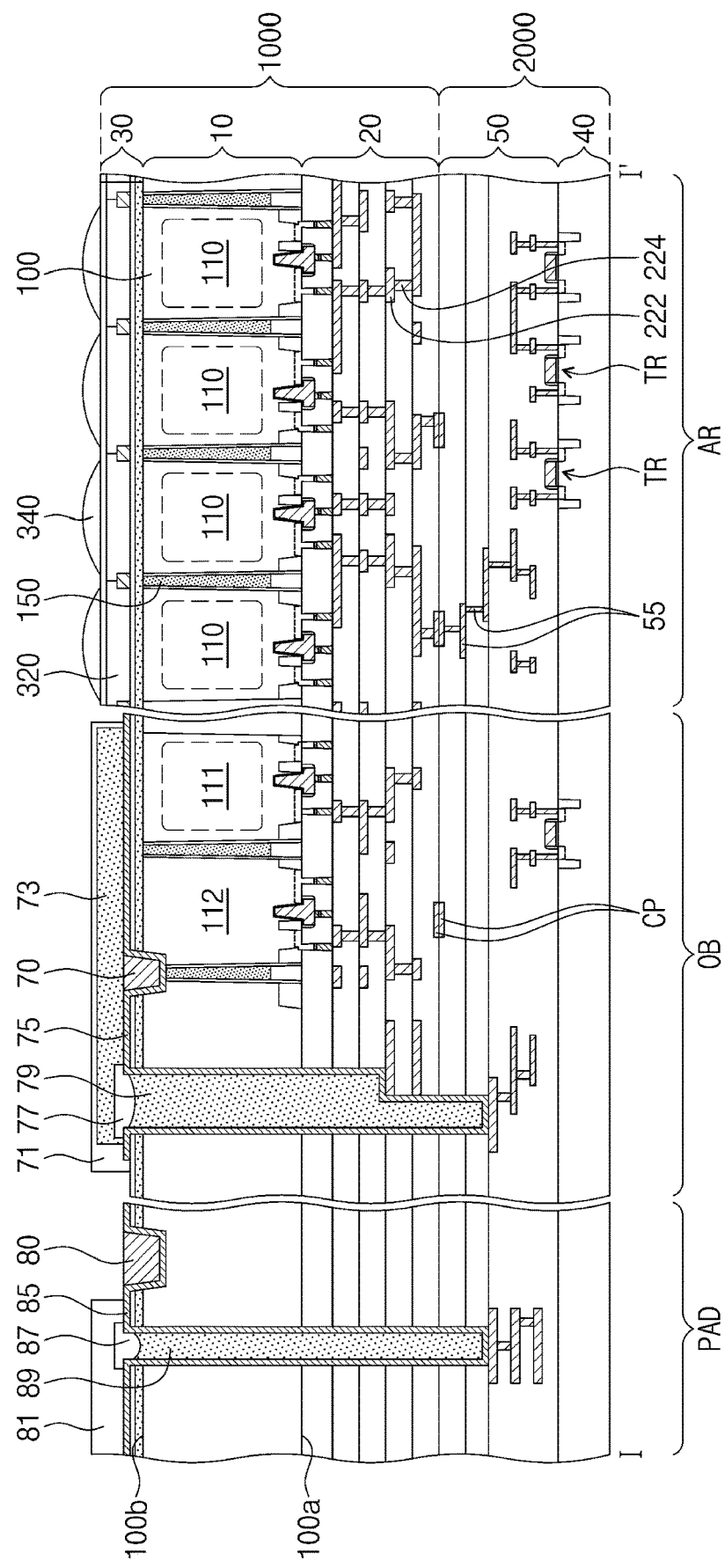
FIG. 3 is a sectional view taken along a line I-I' of FIG. 2.

FIG. 2 is a plan view illustrating an image sensor according to an embodiment of the inventive concept. FIG. 3 is a sectional view taken along a line I-I' of FIG. 2. A pixel or unit pixel refers to a sensor element of an image sensor, and may refer to a smallest addressable light-sensing element of the image sensor.

Referring to FIGS. 2 and 3, the image sensor according to an embodiment of the inventive concept may include a sensor chip 1000 and a circuit chip 2000. The sensor chip 1000 may include a photoelectric conversion layer 10, a first interconnection layer 20, and an optically-transparent layer 30. The photoelectric conversion layer 10 may include a first substrate 100, a device isolation pattern 130, a pixel isolation pattern 150, and gate patterns 171 and 173.

The first substrate 100 may include a pixel array region AR, an optical black region OB, and a pad region PAD. The pixel array region AR may be disposed in a center region of the first substrate 100, when viewed in a plan view. The pixel array region AR may include a plurality of unit pixel regions PX. The unit pixel regions PX may produce and output photoelectric signals from the incident light. The unit pixel regions PX may be two-dimensionally arranged to form a plurality of columns and a plurality of rows. The columns may be parallel to a first direction D1. The rows may be parallel to a second direction D2. In the present specification, the first direction D1 may be parallel to a first surface 100a of the first substrate 100, and the second direction D2 may be parallel to the first surface 100a of the first substrate 100 and may not be parallel to the first direction D1. For example, the second direction D2 may be substantially perpendicular to the first direction D1. A third direction D3 may be perpendicular to both of the first and second directions D1 and D2. The optical black region OB, the pad region PAD, and the circuit chip 2000 will be described below.

Figure 4:
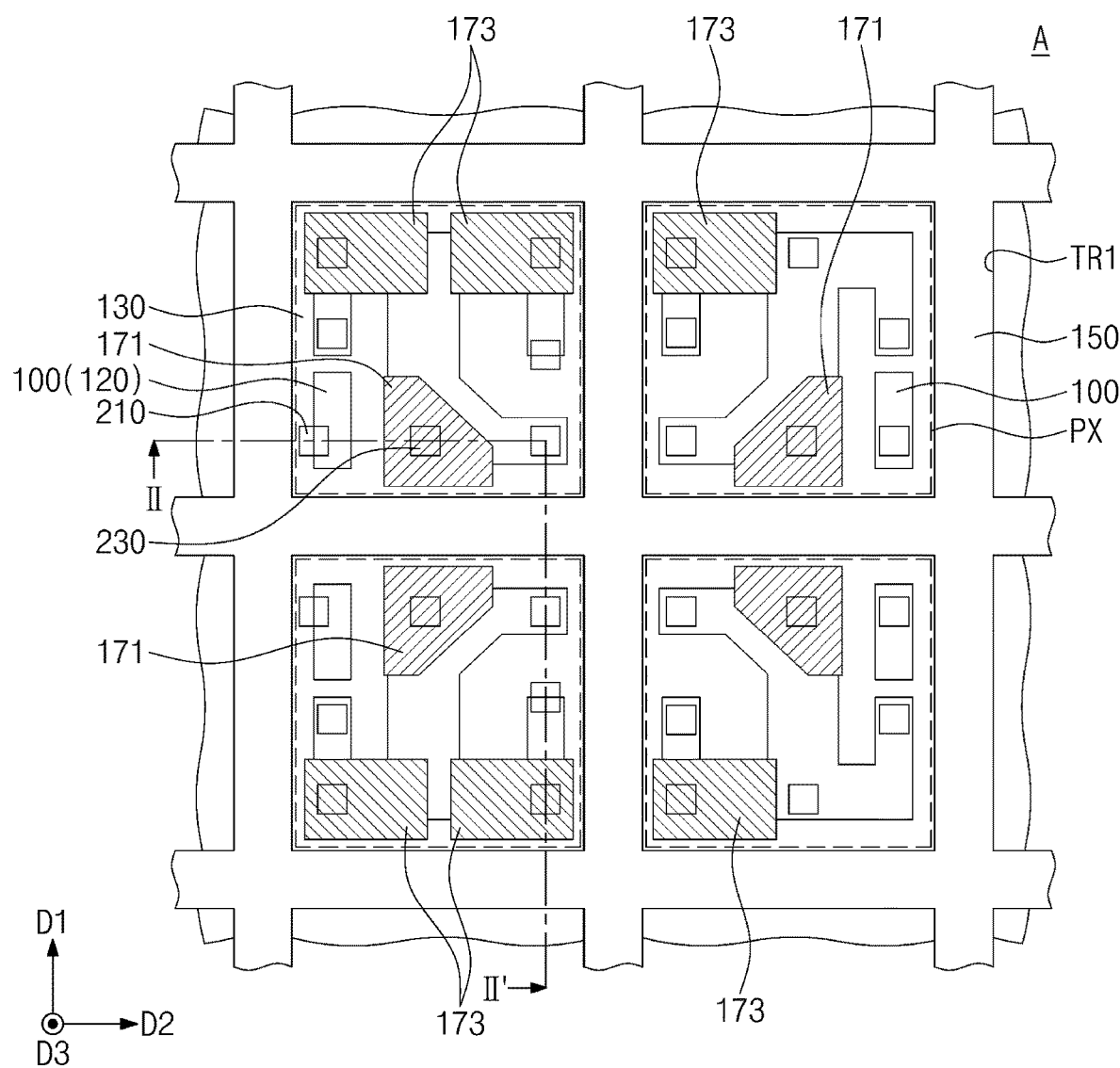
FIG. 4 is an enlarged plan view illustrating a portion A of FIG. 2.
Figure 5:
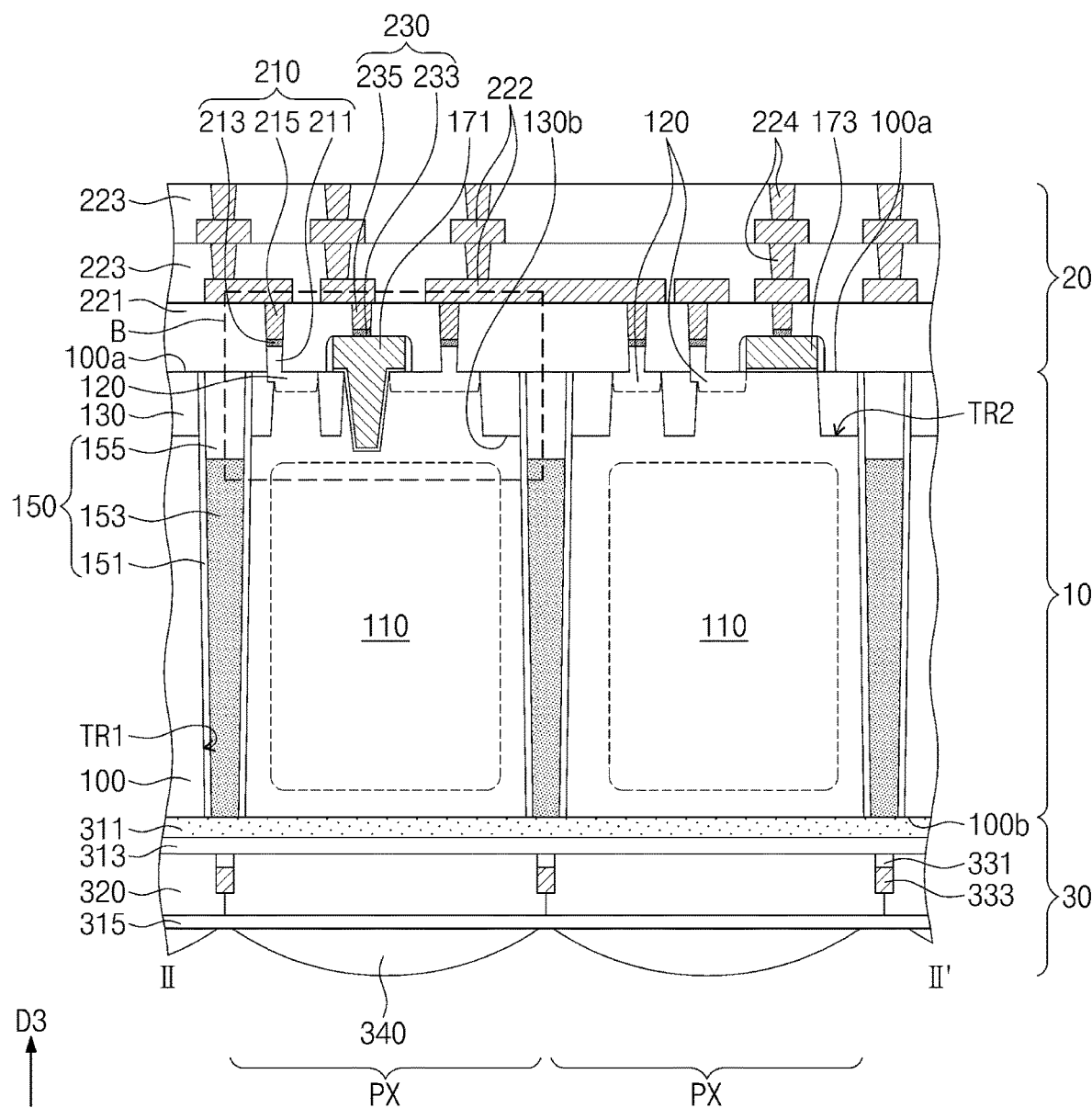
FIG. 5 is a sectional view taken along a line II-IF of FIG. 4.

FIG. 4 is an enlarged plan view illustrating a portion A of FIG. 2. FIG. 5 is a sectional view taken along a line II-II' of FIG. 4.

Referring to FIGS. 4 and 5, the image sensor may include the first substrate 100, the device isolation pattern 130, the pixel isolation pattern 150, the gate patterns 171 and 173, and the first interconnection layer 20. The first interconnection layer 20 may include insulating layers 221 and 223, interconnection lines 222, vias 224, and first and second penetration structures 210 and 230.

The first substrate 100 may have a first surface (or front surface) 100a and a second surface (or rear surface) 100b, which are opposite to each other. Light may be incident into the second surface 100b of the first substrate 100. The first interconnection layer 20 may be disposed on the first surface 100a of the first substrate 100, and the optically-transparent layer 30 may be disposed on the second surface 100b of the first substrate 100. The first substrate 100 may be a semiconductor substrate or a silicon-on-insulator (SOI) substrate. The semiconductor substrate may include or may be, for example, a silicon substrate, a germanium substrate, or a silicon-germanium substrate. The first substrate 100 may include impurities of a first conductivity type. For example, the impurities of the first conductivity type may include p-type impurities, such as aluminum (Al), boron (B), indium (In), and/or gallium (Ga).

The first substrate 100 may include the unit pixel regions PX defined by the pixel isolation pattern 150. The unit pixel regions PX may be arranged in two different directions (e.g., the first and second directions D1 and D2) to form a matrix-shaped arrangement. The first substrate 100 may include a plurality of photoelectric conversion regions 110. The photoelectric conversion regions 110 may be respectively provided in the unit pixel regions PX of the first substrate 100. The photoelectric conversion regions 110 may have the same function as the photoelectric conversion regions PD1, PD2, PD3, and PD4 of FIG. 1. Each of the photoelectric conversion regions 110 may be a region of the first substrate 100 that is doped with impurities of the second conductivity type. The second conductivity type may be different from the first conductivity type. The impurities of the second conductivity type may include n-type impurities (e.g., phosphorus, arsenic, bismuth, and/or antimony). The photoelectric conversion regions 110 may be adjacent to the first surface 100a of the first substrate 100. For example, the photoelectric conversion regions 110 may be disposed to be closer to the first surface 100a than to the second surface 100b. As an example, each of the photoelectric conversion regions 110 may include a first region and a second region, which are provided adjacent to the first surface 100a and the second surface 100b, respectively. The first and second regions of the photoelectric conversion region 110 may be provided to have different impurity concentrations from each other. In this case, the photoelectric conversion region 110 may have a non-vanishing potential gradient between the first and second surfaces 100a and 100b of the first substrate 100. As another example, the photoelectric conversion region 110 may have a vanishing potential gradient between the first and second surfaces 100a and 100b of the first substrate 100.

The first substrate 100 and the photoelectric conversion regions 110 may constitute a photodiode. For example, the first substrate 100 of the first conductivity type and the photoelectric conversion region 110 of the second conductivity type may form a pn junction serving as the photodiode. An amount of photocharges, which are produced and accumulated in the photoelectric conversion region 110 of the photodiode, may be proportional to an intensity of an incident light.

The pixel isolation pattern 150 may be provided in the first substrate 100 to define the unit pixel regions PX. For example, the pixel isolation pattern 150 may be provided between the unit pixel regions PX of the first substrate 100. When viewed in a plan view, the pixel isolation pattern 150 may have a lattice or grid structure. When viewed in a plan view, the pixel isolation pattern 150 may be provided to enclose each of the unit pixel regions PX. The pixel isolation pattern 150 may be provided in a first trench TR1, and the first trench TR1 may be recessed from the first surface 100a of the first substrate 100. The pixel isolation pattern 150 may be extended from the first surface 100a of the first substrate 100 toward the second surface 100b. In an embodiment, a width of the pixel isolation pattern 150 may gradually decrease when it is measured along a path from the first surface 100a of the first substrate 100 toward the second surface 100b. The pixel isolation pattern 150 may be a deep trench isolation layer. The pixel isolation pattern 150 may be provided to penetrate the first substrate 100. The pixel isolation pattern 150 may have substantially the same vertical height as that of the first substrate 100.

The pixel isolation pattern 150 may include a first isolation pattern 151, a second isolation pattern 153, and a capping pattern 155. The first isolation pattern 151 may be provided along a side surface of the first trench TR1. The first isolation pattern 151 may be formed of or include at least one of, for example, silicon-based insulating materials (e.g., silicon nitride, silicon oxide, and/or silicon oxynitride) and/or high-k dielectric materials (e.g., hafnium oxide and/or aluminum oxide). As another example, the first isolation pattern 151 may include a plurality of layers, at least two of which are formed of or include different materials from each other. The first isolation pattern 151 may have a lower refractive index than the first substrate 100. In this case, it may be possible to prevent or suppress a cross-talk issue from occurring between the unit pixel regions PX of the first substrate 100.

The second isolation pattern 153 may be provided in the first trench TR1. The second isolation pattern 153 may fill an inner space of the first trench TR1. A side surface of the second isolation pattern 153 may be surrounded by the first isolation pattern 151. The first isolation pattern 151 may be interposed between the second isolation pattern 153 and the first substrate 100. Accordingly, the second isolation pattern 153 may be spaced apart from the first substrate 100 by the first isolation pattern 151. During an operation of the image sensor, the second isolation pattern 153 may be electrically separated from the first substrate 100 by the first isolation pattern 151. The second isolation pattern 153 may be formed of or include at least one of, for example, silicon oxide, silicon nitride, silicon oxynitride, doped poly silicon, undoped poly silicon, amorphous silicon, and/or metallic materials. In the case where the second isolation pattern 153 includes doped silicon, n-type or p-type impurities as dopants may be contained in the second isolation pattern 153. In the case where the second isolation pattern 153 includes a metallic material, tungsten may be used as the metallic material of the second isolation pattern 153.

The capping pattern 155 may be provided on a top surface of the second isolation pattern 153. The capping pattern 155 may be disposed adjacent to the first surface 100a of the first substrate 100. The capping pattern 155 may have a top surface that is coplanar with the first surface 100a of the first substrate 100. A bottom surface of the capping pattern 155 may be in contact with the top surface of the second isolation pattern 153. The capping pattern 155 may be formed of or include at least one of non-conductive materials. As an example, the capping pattern 155 may be formed of or include at least one of silicon-based insulating materials (e.g., silicon nitride, silicon oxide, and/or silicon oxynitride) and/or high-k dielectric materials (e.g., hafnium oxide and/or aluminum oxide). In this case, the pixel isolation pattern 150 may prevent photocharges, which are produced by light incident into each of the unit pixel regions PX, from entering neighboring ones of the unit pixel regions PX through a random drift phenomenon. In other words, the pixel isolation pattern 150 may prevent a cross-talk issue between the unit pixel regions PX. Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes.

The device isolation pattern 130 may be provided in the first substrate 100. For example, the device isolation pattern 130 may be provided in a second trench TR2, which is recessed from the first surface 100a of the first substrate 100. The device isolation pattern 130 may be a shallow trench isolation (STI) layer. The device isolation pattern 130 may be provided to expose the first surface 100a of the first substrate 100. The device isolation pattern 130 may be provided to define positions and shapes of impurity regions 120, which are provided in an upper portion of the first substrate 100. A bottom surface 130b of the device isolation pattern 130 may be located in the first substrate 100. A width of the device isolation pattern 130 may be gradually decreased, when it is measured along a path from the first surface 100a of the first substrate 100 toward the second surface 100b. The bottom surface 130b of the device isolation pattern 130 may be spaced apart from the photoelectric conversion regions 110. At least a portion of the device isolation pattern 130 may be disposed on an upper side surface of the pixel isolation pattern 150 and may be connected to the upper side surface of the pixel isolation pattern 150. The side surface and the bottom surface 130b of the device isolation pattern 130 and the side surface of the pixel isolation pattern 150 may be provided to form a stepwise structure. A height of the device isolation pattern 130 in the third direction D3 may be smaller than a height of the pixel isolation pattern 150 in the third direction D3. The device isolation pattern 130 may be formed of or include at least one of, for example, silicon oxide, silicon nitride, and/or silicon oxynitride.

The gate patterns 171 and 173 may be provided on the first surface 100a of the first substrate 100. The gate patterns 171 and 173 may include first gate patterns 171, which have a structure including a buried portion, and second gate patterns 173, which have a flat structure. When viewed in a plan view, the gate patterns 171 and 173 may be disposed on each of the unit pixel regions PX. For example, one first gate pattern 171 and at least one second gate pattern 173 may be disposed on each of the unit pixel regions PX. The gate patterns 171 and 173 may not be overlapped with the pixel isolation pattern 150, when viewed in a plan view. The gate patterns 171 and 173 may be used as the gate electrodes of the transfer transistor TX, the source follower transistor SX, the reset transistor RX, the dual conversion transistor DCX, and the selection transistor AX previously described with reference to FIG. 1. For example, the gate patterns 171 and 173 may include the transfer gate TG, the source follower gate SF, the reset gate RG, the dual conversion gate DCG, and the selection gate SEL.

The first interconnection layer 20 may include the insulating layers 221 and 223, the penetration structures 210 and 230, the interconnection lines 222, and the vias 224. The insulating layers 221 and 223 may include a first insulating layer 221 and second insulating layers 223. The first insulating layer 221 may cover the first surface 100a of the first substrate 100. The first insulating layer 221 may be provided between the interconnection lines 222 and the first surface 100a of the first substrate 100 to cover the gate patterns 171 and 173. The second insulating layers 223 may be stacked on the first insulating layer 221. Each of the first and second insulating layers 221 and 223 may be formed of or include at least one of non-conductive materials. For example, each of the first and second insulating layers 221 and 223 may be formed of or include at least one of silicon-based insulating materials (e.g., silicon oxide, silicon nitride, and/or silicon oxynitride).

The interconnection lines 222 may be provided on the first insulating layer 221. More specifically, the interconnection lines 222 may be disposed in the second insulating layers 223 stacked on the first surface 100a of the first substrate 100. The interconnection lines 222 may be electrically connected to the gate patterns 171 and 173 through the vias 224 and penetration structures 210 and 230. Electrical signals, which are generated in the photoelectric conversion regions 110, may be processed in the first interconnection layer 20. In an embodiment, the interconnection lines 222 may be arranged, regardless of the arrangement of the photoelectric conversion regions 110. In other words, the interconnection lines 222 may be provided to cross over the photoelectric conversion regions 110. The lowermost ones of the interconnection lines 222 may be in contact with top surfaces 210a and 230a of the penetration structures 210 and 230. The interconnection lines 222 and the vias 224 may include a material different from the penetration structures 210 and 230. The interconnection lines 222 and the vias 224 may be formed of or include at least one of metallic materials (e.g., copper (Cu)). The interconnection lines 222 and the vias 224 may be electrically connected to the penetration structures 210 and 230. The penetration structures 210 and 230 will be described in more detail below. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The optically-transparent layer 30 may include an anti-reflection layer 311, first and second back-side insulating layers 313 and 315, color filters 320, a grid pattern insulating layer 331, a grid pattern 333, and micro lenses 340. The optically-transparent layer 30 may be configured to collect and filter light, which is incident from the outside, and then to provide the light to the photoelectric conversion layer 10.

In detail, the color filters 320 and the micro lenses 340 may be provided on the second surface 100b of the first substrate 100. The color filters 320 may be disposed on the unit pixel regions PX, respectively. The micro lenses 340 may be disposed on the color filters 320, respectively. The anti-reflection layer 311 and the first back-side insulating layer 313 may be provided between the second surface 100b of the first substrate 100 and the color filters 320. The anti-reflection layer 311 may be configured to prevent light, which is incident into the second surface 100b of the first substrate 100, from being reflected, and this may allow the light to be effectively incident into the photoelectric conversion regions 110. The second back-side insulating layer 315 may be provided between the color filters 320 and the micro lenses 340. The first back-side insulating layer 313 and the second back-side insulating layer 315 may include at least one of a fixed charged layer, an adhesive layer, and a protection layer. Each of the first back-side insulating layer 313 and the second back-side insulating layer 315 may include a plurality of layers, unlike that shown in the drawings, and may be formed of or include at least one of metal oxides (e.g., aluminum oxide or hafnium oxide) or silicon-based insulating materials (e.g., silicon oxide or silicon nitride).

The color filters 320 may be disposed at positions corresponding to the unit pixel regions, respectively. The color filters 320 may include primary color filters. The color filters 320 may include first to third color filters, which allow lights of different colors to pass therethrough. As an example, the first to third color filters may be configured to be transparent to green, red, and blue lights. The first to third color filters may be arranged in a Bayer pattern. As another example, the first to third color filters may be configured to be transparent to lights of other colors (e.g., cyan, magenta, or yellow).

The micro lenses 340 may be disposed on bottom surfaces of the color filters 320, respectively. The micro lenses 340 may be vertically overlapped with the photoelectric conversion regions 110, respectively. The micro lenses 340 may be connected to each other, unlike the structure shown in the drawings. The micro lenses 340 may be transparent and may allow an incident light to pass therethrough. The micro lenses 340 may have a convex shape, and in this case, it may be possible to more effectively condense light, which is incident into the unit pixel regions PX. The micro lenses 340 may be formed of or include at least one of organic materials. For example, the micro lenses 340 may be formed of or include at least one of photoresist materials or thermosetting resins.

Figure 6:
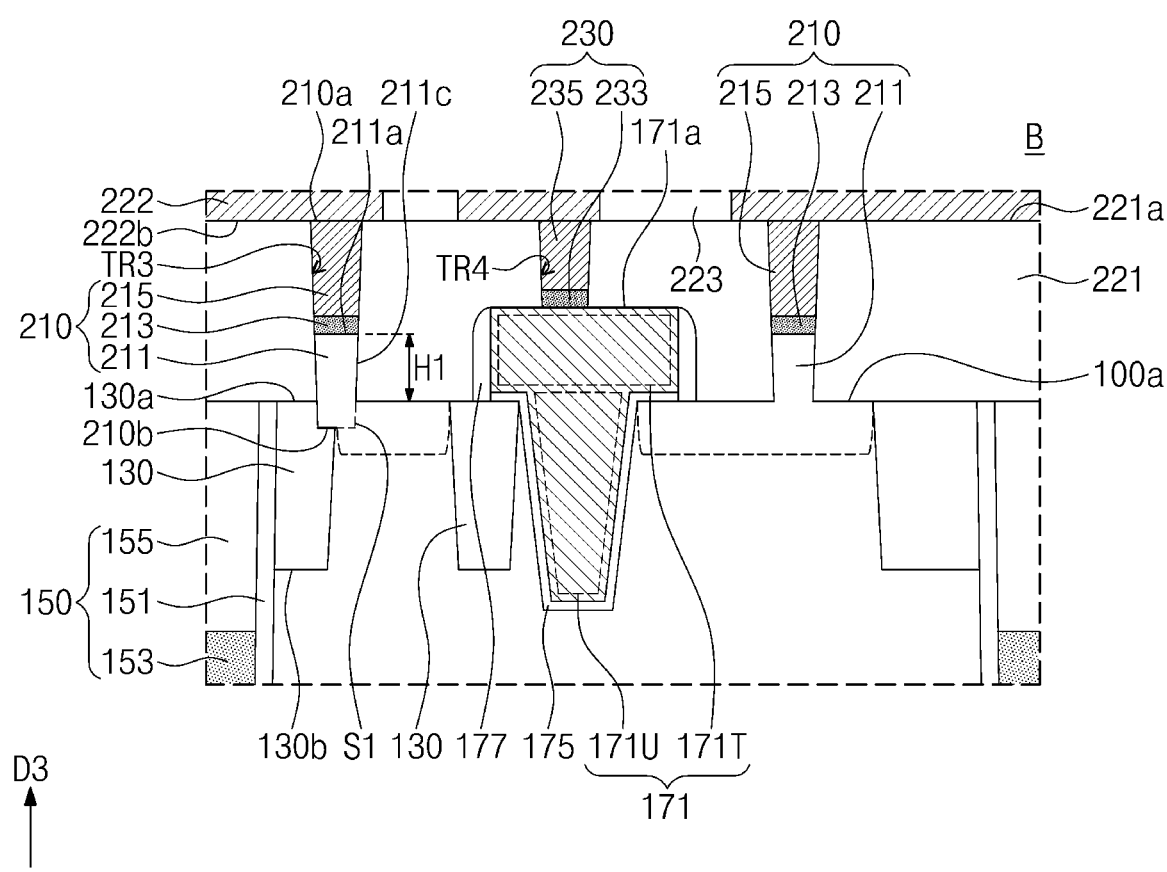
FIG. 6 is an enlarged sectional view illustrating a portion B of FIG. 5.

FIG. 6 is an enlarged sectional view illustrating a portion B of FIG. 5. Hereinafter, the gate patterns 171 and 173 and the penetration structures 210 and 230 will be described in more detail below.

Referring to FIG. 6 in conjunction with FIG. 5, the first gate patterns 171 may include a first portion 171T and a second portion 171U. The first portion 171T of each of the first gate patterns 171 may be disposed on the first surface 100a of the first substrate 100. The first portion 171T may be extended in a direction parallel to the first surface 100a of the first substrate 100. The second portion 171U of each of the first gate patterns 171 may be a protruding portion, which is extended from the first portion 171T into the first substrate 100. The second portion 171U may be connected to the first portion 171T. The first gate patterns 171 may include the transfer gates TG. The first gate patterns 171 may be formed of or include at least one of metallic materials, metal silicides, poly silicon, or combinations thereof.

As shown in FIG. 5, each of the second gate patterns 173 may be disposed on the first surface 100a of the first substrate 100. Each of the second gate patterns 173 may be extended in a direction parallel to the first surface 100a of the first substrate 100. Each of the second gate patterns 173 may be rectangular, when viewed in a plan view. The second gate patterns 173 may include the source follower gate SF, the reset gate RG, the dual conversion gate DCG, and the selection gate SEL.

A gate insulating pattern 175 may be interposed between each of the gate patterns 171 and 173 and the first substrate 100. The gate insulating pattern 175 may be formed of or include at least one of, for example, silicon-based insulating materials and/or high-k dielectric materials. A gate spacer 177 may be provided on the first surface 100a of the first substrate 100 to cover the side surface of the first portion 171T of each of the first gate patterns 171 and the side surface of each of the second gate patterns 173. The gate spacer 177 may be formed of or include at least one of, for example, semiconductor nitrides (e.g., silicon nitride, silicon carbonitride, or silicon oxynitride).

The penetration structures 210 and 230 may be provided on the first surface 100a of the first substrate 100. The penetration structures 210 and 230 may be provided in the first insulating layer 221. The penetration structures 210 and 230 may be disposed between the first substrate 100 and the interconnection lines 222. The penetration structures 210 and 230 may include first penetration structures 210 and second penetration structures 230. The first penetration structures 210 may be connected to the first substrate 100, and the second penetration structures 230 may be connected to the gate patterns 171 and 173.

The first penetration structures 210 may be provided between the first substrate 100 and the interconnection lines 222. The first penetration structures 210 vertically extend to connect the impurity regions 120 of the first substrate 100 to the interconnection lines 222. The first penetration structures 210 may be provided in third trenches TR3. The first penetration structures 210 may be provided to fill inner spaces of the third trenches TR3. The third trenches TR3 may be provided to penetrate the first insulating layer 221 and to penetrate at least a portion of an upper portion of the first substrate 100. The first penetration structures 210 may be disposed to be spaced apart from the gate patterns 171 and 173 adjacent thereto. Each of the first penetration structures 210 may include a first pattern 211 connected to the first substrate 100, a second pattern 213 provided on the first pattern 211, and a third pattern 215 connected to the interconnection lines 222. The first pattern 211, the second pattern 213, and the third pattern 215 may be vertically aligned with each other. The first pattern 211, the second pattern 213, and the third pattern 215 may be formed of or include different materials from each other. For convenience in description, just one of the plurality of first penetration structures 210 will be mentioned in the following description. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The first pattern 211 may be provided on the impurity region 120 of the first substrate 100. The first pattern 211 may fill a lower region of the third trench TR3. The first pattern 211 may be connected to the impurity region 120 of the first substrate 100. The first pattern 211 may be formed of or include the same material as the first substrate 100. For example, the first pattern 211 may be formed of or include poly silicon doped with impurities. The impurities may be of the second conductivity type and may include n-type impurities (e.g., phosphorus (P), arsenic (As), bismuth (Bi), and/or antimony (Sb)). An interface 51 between the first pattern 211 and the first substrate 100 may not be observable or distinct.

According to an embodiment of the inventive concept, with respect to a first subset of the first penetration structures 210, the first pattern 211 may be vertically overlapped with both of the device isolation pattern 130 adjacent thereto and the impurity region 120 adjacent thereto. As an example, the first pattern 211 may be disposed on a boundary between the device isolation pattern 130 and the impurity region 120 of the first substrate 100. The first pattern 211 may be in contact with at least a portion of the device isolation pattern 130 adjacent thereto and the impurity region 120 adjacent thereto. More specifically, one side surface 211c and a bottom surface 210b of the first pattern 211 may be in contact with the device isolation pattern 130 and another side surface 211c and the bottom surface 210b of the first pattern 211 may be in contact with the impurity region 120. As another example, with respect to a second subset of the first penetration structures 210, the first pattern 211 may be connected to the impurity region 120 of the first substrate 100 and may be spaced apart from the device isolation pattern 130.

The bottom surface 210b of the first pattern 211 may be the bottom surface 210b of the first penetration structure 210. The bottom surface 210b of the first pattern 211 may be provided at a level between the first surface 100a of the first substrate 100 and the bottom surface of the device isolation pattern 130. A top surface 211a of the first pattern 211 may be provided at a level between the first surface 100a of the first substrate 100 and top surfaces 171a and 173a of the gate patterns 171 and 173 adjacent thereto. A distance H1 from the first surface 100a of the first substrate 100 to the top surface 211a of the first pattern 211 in the third direction D3 may range from 100 Å to 1800 Å.

The second pattern 213 of the first penetration structure 210 may be provided on the top surface 211a of the first pattern 211. The second pattern 213 may be disposed between the first pattern 211 and the third pattern 215 of the first penetration structure 210. The second pattern 213 may cover the top surface 211a of the first pattern 211. Accordingly, the first pattern 211 and the third pattern 215 of the first penetration structure 210 may be vertically spaced apart from each other. A thickness of the second pattern 213 in the third direction D3 may range from 50 Å to 200 Å. The second pattern 213 may be formed of or include at least one of metal silicides (e.g., cobalt silicide (CoSix) and/or nickel silicide (NiSix)). The second pattern 213 may electrically connect the first pattern 211 to the third pattern 215. Due to the second pattern 213, the first pattern 211 and the third pattern 215 may be connected to each other with improved electric connection characteristics.

In the case where a metal silicide material is interposed between a semiconductor material and a metallic material, conduction of electric charges between the semiconductor material and the metallic material may be improved. However, in the case where the metal silicide material is disposed near the photoelectric conversion region 110, a photoelectric conversion property of the photoelectric conversion region 110 may be deteriorated. According to an embodiment of the inventive concept, the first penetration structure 210 may include the second pattern 213, which is formed of or include a metal silicide material and is interposed between the first pattern 211 including silicon and the third pattern 215 including a metallic material. The second pattern 213 may facilitate the conduction of electric charges between the first pattern 211 and the third pattern 215. Since the second pattern 213 is provided at a level higher than the first surface 100a of the first substrate 100, it may be possible to prevent the second pattern 213 from being excessively close to the photoelectric conversion region 110. Accordingly, it may be possible to improve the photoelectric conversion property of the image sensor.

The third pattern 215 of the first penetration structure 210 may be disposed between the second pattern 213 and the interconnection lines 222. The third pattern 215 may fill an upper region of the third trench TR3. A top surface of the third pattern 215 may be in contact with a bottom surface 222b of the lowermost interconnection line 222 of the interconnection lines 222, and a bottom surface of the third pattern 215 may be in contact with a top surface of the second pattern 213. The top surface of the third pattern 215 may be the top surface 210a of the first penetration structure 210. The top surface of the third pattern 215 may be coplanar with the top surface of the first insulating layer 221. The third pattern 215 may be formed of or include at least one of metallic materials (e.g., tungsten, copper, aluminum, and/or alloys thereof). The third pattern 215 may be formed of or include a metallic material different from the interconnection lines 222. For example, the third pattern 215 may be formed of or include tungsten, and the interconnection lines 222 may be formed of or include copper.

The second penetration structures 230 may be disposed between the gate patterns 171 and 173 and the interconnection lines 222. The second penetration structures 230 may vertically extend to connect the gate patterns 171 and 173 to the interconnection lines 222. The second penetration structures 230 may be provided in fourth trenches TR4, respectively. The second penetration structures 230 may fill inner spaces of the fourth trenches TR4. The fourth trenches TR4 may be provided to penetrate the first insulating layer 221 and to expose the top surface of each of the gate patterns 171 and 173. Each of the second penetration structures 230 may be vertically overlapped with a corresponding one of the gate patterns 171 and 173. Each of the second penetration structures 230 may include a first pattern 233 connected to the gate pattern 171 or 173 and a second pattern 235 provided on the first pattern 233. The first pattern 233 and the second pattern 235 may be vertically aligned with each other. The first pattern 233 and the second pattern 235 may be formed of or include different materials from each other.

The first patterns 233 of the second penetration structures 230 may be provided on the top surfaces of the gate patterns 171 and 173, respectively. Each of the first patterns 233 may be in contact with the top surface of a corresponding one of the gate patterns 171 and 173. A thickness of each of the first patterns 233 in the third direction D3 may range from 50 Å to 200 Å. The first patterns 233 may be formed of or include at least one of metal silicides (e.g., cobalt silicide (CoSix) and/or nickel silicide (NiSix)). The first patterns 233 may be provided to electrically connect the second patterns 235 to the gate patterns 171 and 173, respectively.

The second patterns 235 of the second penetration structures 230 may be provided on the first patterns 233, respectively. The second patterns 235 of the second penetration structures 230 may be respectively provided to fill inner spaces of the fourth trenches TR4. The second patterns 235 may be vertically aligned with the first patterns 233. Each of the second patterns 235 may connect a corresponding one of the first patterns 233 to the lowermost interconnection lines 222 of the interconnection lines 222. The second patterns 235 may be formed of or include a metallic material different from the first patterns 233 and the interconnection lines 222. For example, the second patterns 235 may be formed of or include tungsten, copper, aluminum, and/or alloys thereof.

Referring further to FIG. 6, the second penetration structure 230 may be disposed between a pair of the first penetration structures 210. As an example, one of the pair of first penetration structures 210 may be horizontally spaced apart from the first gate pattern 171 and may be vertically overlapped with both of the device isolation pattern 130 and the impurity region 120. The other of the pair of first penetration structures 210 may be spaced apart from each of the first gate pattern 171 and the device isolation pattern 130 adjacent thereto. The other of the pair of first penetration structures 210 may not be overlapped with the device isolation pattern 130 and may be connected to the impurity region 120. The second patterns 213 of the first penetration structures 210 and the first pattern 233 of the second penetration structure 230 may be provided at different levels from each other. For example, the first pattern 233 of the second penetration structure 230 may be provided at a level higher than the second patterns 213 of the first penetration structures 210.

Referring back to FIG. 4, the first penetration structures 210 and the second penetration structures 230 may be provided in each unit pixel region PX. For example, one first gate pattern 171 and at least one second gate pattern 173 may be disposed in the unit pixel region PX. When viewed in a plan view, the first penetration structures 210 may not be overlapped with the gate patterns 171 and 173, and the second penetration structures 230 may be overlapped with the gate patterns 171 and 173. The capacitance between the transfer gates TG1, TG2, TG3, and TG4 and the source follower gate SF or the capacitance between the transfer gates TG1, TG2, TG3, and TG4 and the dual conversion gate DCG described in FIG. 1 may be adjusted according to the planar arrangement of the first penetration structures 210 and the second penetration structures 230. According to an embodiment of the inventive concept, one of the first penetration structures 210 may be disposed to be overlapped with both of the device isolation pattern 130 and the impurity region 120, which is exposed by the device isolation pattern 130. Accordingly, a space between the one of the first penetration structures 210 and the gate pattern adjacent thereto may be increased, and the gate patterns 171 and 173 may be designed to have increased areas. In the case where the areas of the gate patterns 171 and 173 are increased, electric characteristics of the image sensor may be improved.

Figure 7:
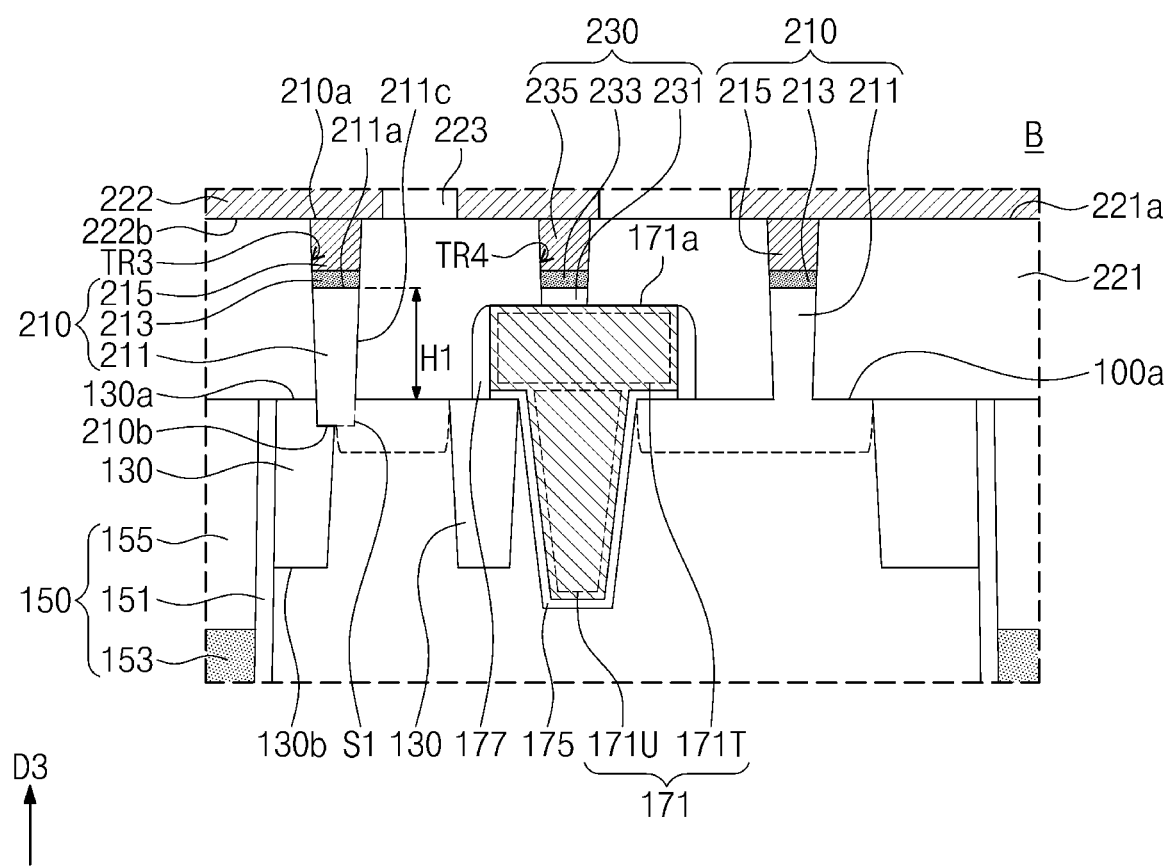
FIG. 7 is a sectional view illustrating a portion (e.g., the portion B of FIG. 5) of an image sensor according to an embodiment of the inventive concept.

FIG. 7 is a sectional view illustrating a portion (e.g., the portion B of FIG. 5) of an image sensor according to an embodiment of the inventive concept. For concise description, a previously described element may be identified by the same reference number without repeating an overlapping description thereof.

Referring to FIG. 7, the image sensor may include the first substrate 100, the device isolation pattern 130, the pixel isolation pattern 150, the gate patterns 171 and 173, and the first interconnection layer 20. The first interconnection layer 20 may include the insulating layers 221 and 223, the interconnection lines 222, vias 224, and the first and second penetration structures 210 and 230.

The first substrate 100, the device isolation pattern 130, the pixel isolation pattern 150, the gate patterns 171 and 173, the insulating layers 221 and 223, and the interconnection lines 222, vias 224 may be substantially the same as those described with reference to FIGS. 1 to 6.

The first penetration structures 210 may be provided between the first substrate 100 and the interconnection lines 222. The first penetration structures 210 may vertically extend to connect the impurity regions 120 of the first substrate 100 to the interconnection lines 222. The third trenches TR3 may be provided to penetrate the first insulating layer 221 and at least a portion of an upper portion of the first substrate 100. The first penetration structures 210 may be spaced apart from the gate patterns 171 and 173 adjacent thereto. Each of the first penetration structures 210 may include the first pattern 211 connected to the first substrate 100, the second pattern 213 provided on the first pattern 211, and the third pattern 215 connected to the interconnection lines 222.

The first pattern 211 may be provided on the impurity region 120 of the first substrate 100. The first pattern 211 may be connected to the impurity region 120 of the first substrate 100. The top surface 211a of the first pattern 211 may be provided at a level higher than the top surface 171a of the first gate pattern 171. For example, the top surface 211a of the first pattern 211 may be provided at a level between the top surface 171a of the first gate pattern 171 and the bottom surfaces 222b of the lowermost interconnection lines 222.

The second pattern 213 may be provided on the first pattern 211. The second pattern 213 may be substantially the same as the second pattern 213 of the first penetration structure 210 described with reference to FIGS. 5 and 6. The third pattern 215 may be provided on the second pattern 213. The third pattern 215 may be substantially the same as the third pattern 215 described with reference to FIGS. 5 and 6.

The second penetration structure 230 may be provided between the first gate pattern 171 and the interconnection lines 222. The second penetration structure 230 may further include a third pattern 231. More specifically, the second penetration structure 230 may include the third pattern 231 in contact with the first gate pattern 171, the second pattern 235 provided on the third pattern 231, and the first pattern 233 provided between the second pattern 235 and the third pattern 231. The first pattern 233 and the second pattern 235 may be substantially the same as the first pattern 233 and the second pattern 235 of the second penetration structure 230 described with reference to FIGS. 5 and 6.

The third pattern 231 may be formed of or include the same material as the first substrate 100. More specifically, the third pattern 231 may be formed of or include poly silicon doped with impurities. The impurities may be of the second conductivity type and may include n-type impurities (e.g., phosphorus (P), arsenic (As), bismuth (Bi), and/or antimony (Sb)). The third pattern 231 may connect the first gate pattern 171 electrically to the first pattern 233.

The second pattern 213 of the first penetration structure 210 and the first pattern 233 of the second penetration structure 230 may be provided at the same level. More specifically, a vertical distance from the second pattern 213 of the first penetration structure 210 to the bottom surface 222b of the lowermost interconnection lines 222 may be substantially equal to a vertical distance from the first pattern 233 of the second penetration structure 230 to the bottom surface 222b of the lowermost interconnection lines 222.

Figure 8:
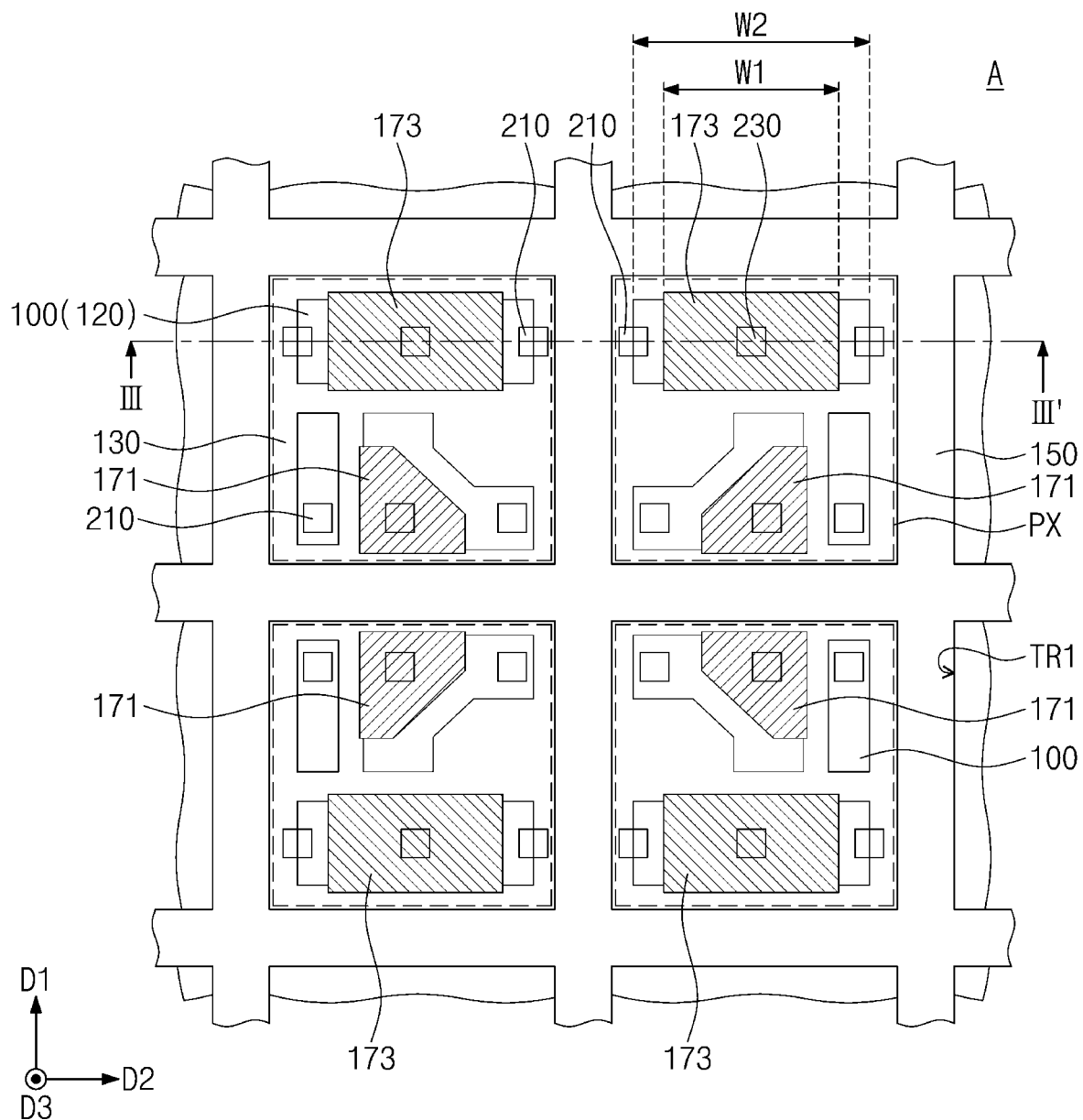
FIG. 8 is a plan view illustrating a portion (e.g., the portion A of FIG. 2) of an image sensor according to an embodiment of the inventive concept.
Figure 9:
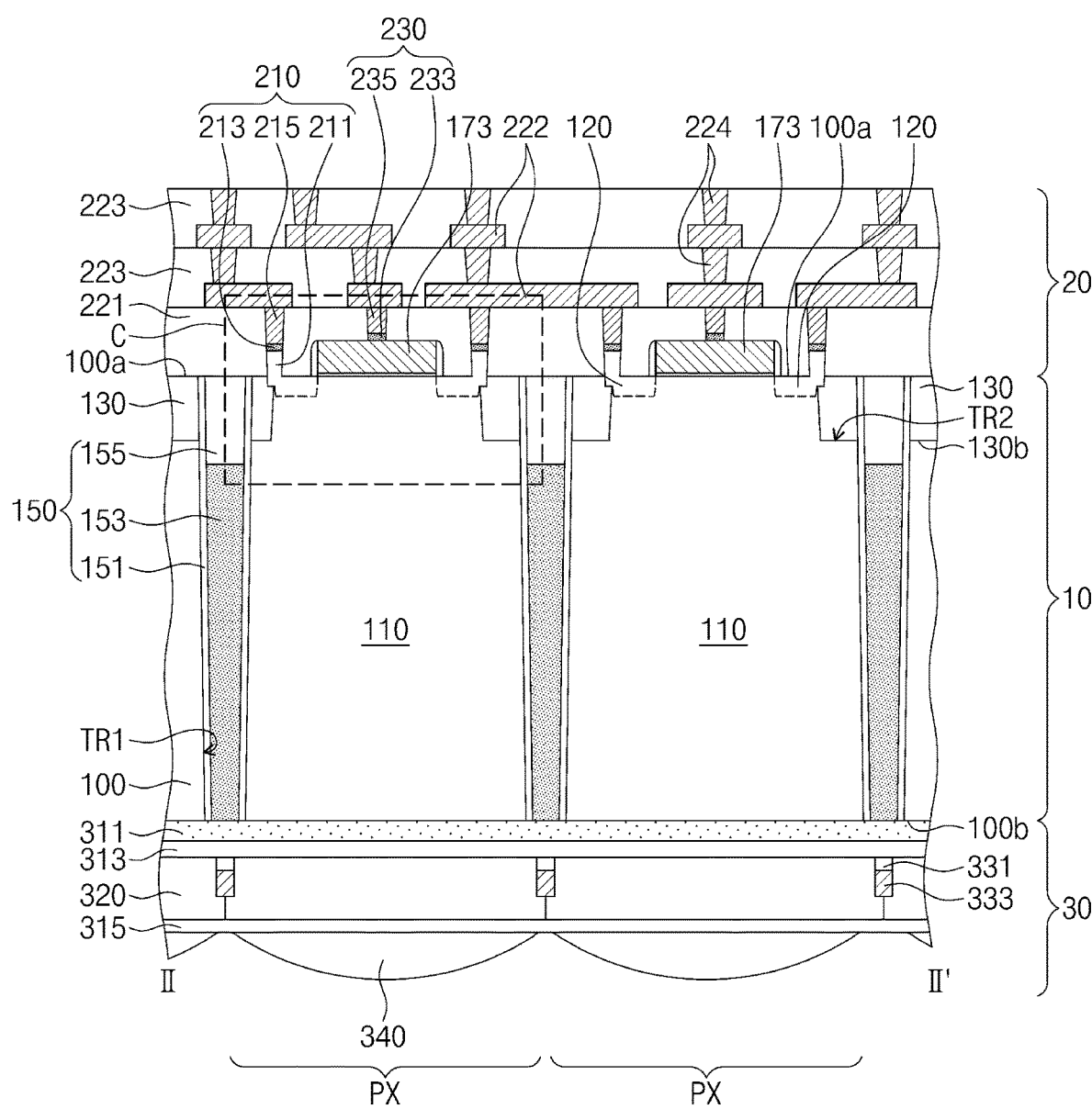
FIG. 9 is a sectional view taken along a line of FIG. 8.
Figure 10:
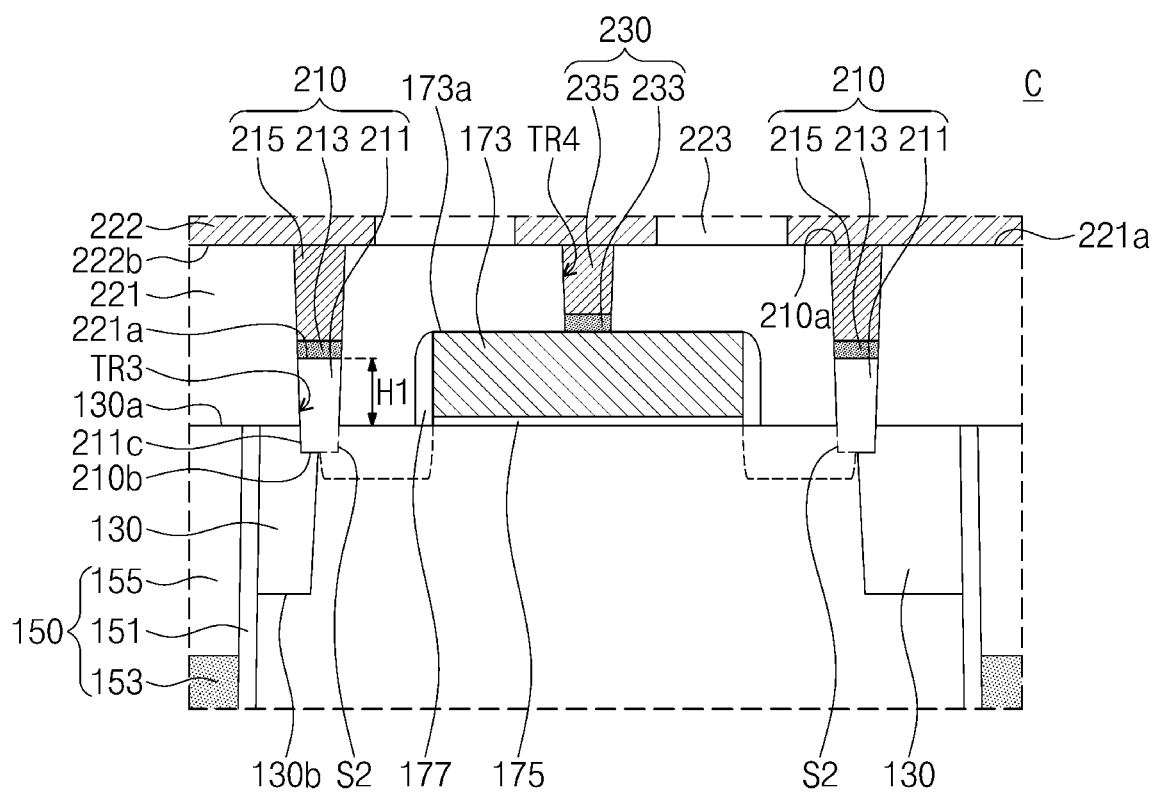
FIG. 10 is an enlarged sectional view illustrating a portion C of FIG. 9.

FIG. 8 is a plan view illustrating a portion (e.g., the portion A of FIG. 2) of an image sensor according to an embodiment of the inventive concept. FIG. 9 is a sectional view taken along a line of FIG. 8. FIG. 10 is an enlarged sectional view illustrating a portion C of FIG. 9.

Referring to FIGS. 8 and 9, the image sensor according to the present embodiment may include the first substrate 100, the device isolation pattern 130, the pixel isolation pattern 150, the gate patterns 171 and 173, and the first interconnection layer 20. The first interconnection layer 20 may include the insulating layers 221 and 223, the interconnection lines 222, vias 224, and the first and second penetration structures 210 and 230. The first substrate 100, the device isolation pattern 130, the pixel isolation pattern 150, the insulating layers 221 and 223 and the interconnection lines 222 and 224 may be substantially the same as those described with reference to FIGS. 4 and 5. For concise description, a previously described element may be identified by the same reference number without repeating an overlapping description thereof.

Referring to FIGS. 8 and 9, the gate patterns 171 and 173 may be provided on the first surface 100a of the first substrate 100. The gate patterns 171 and 173 may include the first gate patterns 171, which have a structure including a buried portion, and the second gate patterns 173, which have a flat structure. When viewed in a plan view, each of the unit pixel regions PX may include one first gate pattern 171 and one second gate pattern 173. The first gate pattern 171 and the second gate pattern 173 may be disposed to be spaced apart from each other. Four adjacent ones of the unit pixel regions PX may constitute a single pixel region group. Each of the four adjacent ones of the unit pixel regions PX may have a structure that is symmetric to the unit pixel region PX adjacent thereto in the first or second direction D1 or D2. For example, the second gate patterns 173 and the first gate patterns 171, which are disposed in each of a pair of the unit pixel regions PX aligned in the second direction D2, may be aligned to each other in the second direction D2. The gate insulating pattern 175 and the gate spacer 177 may be substantially the same as those described with reference to FIGS. 4 and 5. For convenience in description, one of the unit pixel regions PX will be mentioned in the following description.

Referring to FIGS. 9 and 10, the penetration structures 210 and 230 may be provided on the first surface 100a of the first substrate 100. The penetration structures 210 and 230 may be provided in the first insulating layer 221. The penetration structures 210 and 230 may be disposed between the first substrate 100 and the interconnection lines 222. The penetration structures 210 and 230 may include a pair of the first penetration structures 210 and the second penetration structure 230. The pair of the first penetration structures 210 may be connected to the first substrate 100, and the second penetration structures 230 may be connected to the second gate pattern 173.

The pair of the first penetration structures 210 may be provided between the first substrate 100 and the interconnection lines 222. The first penetration structures 210 may vertically extend to connect the impurity regions 120 of the first substrate 100 to the interconnection lines 222. The first penetration structures 210 may be provided in the third trenches TR3. The first penetration structures 210 may be disposed to be horizontally spaced apart from each other with the second gate pattern 173 interposed therebetween. The first penetration structures 210 may be provided to fill inner spaces of the third trenches TR3. The first penetration structure 210 may penetrate an upper portion of the first substrate 100 and at least a portion of an upper portion of the device isolation pattern 130 adjacent thereto. Each of the first penetration structures 210 may include the first pattern 211 connected to the first substrate 100, the second pattern 213 provided on the first pattern 211, and the third pattern 215 connected to the interconnection lines 222. The first pattern 211, the second pattern 213, and the third pattern 215 may be vertically aligned with each other. The first pattern 211, the second pattern 213, and the third pattern 215 may be formed of or include different materials from each other. The first to third patterns 211, 213, and 215 may be substantially the same as those described with reference to FIG. 6.

The second penetration structure 230 may be provided on the gate pattern 171 or 173 (e.g., the second gate pattern 173). The second penetration structure 230 may vertically extend to connect the second gate pattern 173 to the interconnection line 222. The second penetration structure 230 may be provided in the fourth trench TR4. The second penetration structure 230 may be provided to fill an inner space of the fourth trench TR4. The fourth trench TR4 may be provided to penetrate the first insulating layer 221 and to expose a top surface of the second gate pattern 173. The second penetration structure 230 may be vertically overlapped with the second gate pattern 173 adjacent thereto. The second penetration structure 230 may include the first pattern 233, which is connected to the second gate pattern 173, and the second pattern 235, which is provided on the first pattern 233. The first pattern 233 and the second pattern 235 may be vertically aligned with each other. The first pattern 233 and the second pattern 235 may be formed of or include different materials. In an embodiment, although not shown, the second penetration structure 230 may further include the third pattern 215 interposed between the first pattern 233 and the top surface 173a of the second gate pattern 173.

The second penetration structure 230 may be disposed between a pair of the first penetration structures 210. The first penetration structures 210 and the second penetration structure 230 may be disposed to be aligned to each other in a specific direction. For example, top surface of each of the first penetration structures 210 and the top surface of the second penetration structure 230 may be provided at the same level. In another example, the second patterns 213 of the first penetration structures 210 and the first pattern 233 of the second penetration structure 230 may be provided at different levels from each other. However, the inventive concept is not limited to this example, and in an embodiment, the second patterns 213 of the first penetration structures 210 and the first pattern 233 of the second penetration structure 230 may be provided at the same level. According to an embodiment of the inventive concept, a pair of the first penetration structures 210 may be disposed at outer regions of the unit pixel region PX which are more distant from the second penetration structure 230. Accordingly, each of the pair of the first penetration structures 210 may be overlapped with both of the impurity region 120 and the device isolation pattern 130, which are adjacent thereto. Accordingly, the second gate pattern 173 connected to the second penetration structure 230 may be designed to have an increased size. More specifically, a width W1 of the second gate pattern 173 in the second direction D2 may be increased. For example, a ratio of the width W1 of the second gate pattern 173 to a width W2 of the first surface 100a of the first substrate 100 exposed by the device isolation pattern 130 may range from 0.5 to 0.7, where the widths are measured in the second direction D2.

Hereinafter, the optical black region OB and the pad region PAD of the first substrate 100 of the image sensor as illustrated in FIG. 3 will be described in more detail.

The optical black region OB may be disposed between the pixel array region AR and the pad region PAD of the first substrate 100. The optical black region OB may be provided to enclose the pixel array region AR, when viewed in a plan view. A first contact plug 70, a first protection layer 71, a light-blocking pattern 73, a first conductive pattern 75, a first capping pattern 77, and a first gapfill pattern 79 may be provided on the optical black region OB.

The first contact plug 70 may be provided on the second surface 100b of the first substrate 100 or in the first substrate 100. A first contact trench may be formed on the second surface 100b of the first substrate 100, and the first contact plug 70 may be provided in the first contact trench. The first contact plug 70 may be formed of or include at least one of metallic materials (e.g., aluminum). The first contact plug 70 may be electrically connected to the pixel isolation pattern 150 (in particular, the second isolation pattern 153).

The first conductive pattern 75 may be provided on the second surface 100b of the first substrate 100. The first conductive pattern 75 may cover the first back-side insulating layer 313 on the second surface 100b of the first substrate 100 and may conformally cover inner surfaces of a first penetration hole and the first contact trench. The first conductive pattern 75 may be provided to penetrate the photoelectric conversion layer 10, the first interconnection layer 20, and a portion of the circuit chip 2000. More specifically, the first conductive pattern 75 may be in contact with the interconnection lines 222 in the first interconnection layer 20 and the pixel isolation patterns 150 and may be electrically connected to them. The first conductive pattern 75 may be electrically connected to lower interconnection lines 55 in the circuit chip 2000. The first conductive pattern 75 may be formed of or include at least one of metallic materials (e.g., tungsten).

The first gapfill pattern 79 may be provided on the first conductive pattern 75 to fill the remaining region of the first penetration hole. The first gapfill pattern 79 may be provided to penetrate the photoelectric conversion layer 10 and the first interconnection layer 20. The first capping pattern 77 may be provided on the first gapfill pattern 79. The first capping pattern 77 may be formed of or include at least one of silicon-containing insulating materials (e.g., silicon oxide, silicon nitride, silicon oxynitride, and/or combinations thereof).

The light-blocking pattern 73 may be provided on the first contact plug 70, the first conductive pattern 75, and the first gapfill pattern 79. The light-blocking pattern 73 may prevent light from being incident into the optical black region OB. The first protection layer 71 may be provided on the light-blocking pattern 73 to cover the light-blocking pattern 73.

A photoelectric conversion region 111 and a dummy region 112 may be provided in the optical black region OB of the first substrate 100. The photoelectric conversion region 111 may be doped to have a second conductivity type that is different from the first conductivity type. The second conductivity type may be for example, an n-type. Unlike the photoelectric conversion region 110 described with reference to FIGS. 4 and 5, the photoelectric conversion region 111 may not be configured to produce electrical signals from an incident light. The dummy region 112 may be a region that is not doped with impurities. Signals, which are produced in the photoelectric conversion region 111 and the dummy region 112, may be used as information for removing a process noise in a subsequent step.

The pad region PAD may be provided in an edge region of the first substrate 100 and may be enclosed by the pixel array region AR, when viewed in a plan view. A second conductive pattern 85, a second gapfill pattern 89, a second capping pattern 87, a second contact plug 80, and a second protection layer 81 may be provided on the pad region PAD of the first substrate 100.

The second contact plug 80 may be provided on the pad region PAD. More specifically, the second contact plug 80 may be provided on the second surface 100b of the first substrate 100 or in the first substrate 100. A second contact trench may be formed on the second surface 100b of the first substrate 100, and the second contact plug 80 may be provided in the second contact trench. The second contact plug 80 may serve as an electric connection path between the image sensor and the outside. More specifically, the second contact plug 80 may be used to output electrical signals, which are generated in the unit pixel regions PX, to the outside. Alternatively, an external electrical signal applied to the second contact plug 80 may be applied to the pixel isolation pattern 150.

The second conductive pattern 85 may be provided on the second surface 100b of the first substrate 100 or in the first substrate 100. The second conductive pattern 85 may cover the first back-side insulating layer 313 on the second surface 100b of the first substrate 100 and may conformally cover inner surfaces of a second penetration hole and the second contact trench. The second conductive pattern 85 may penetrate the photoelectric conversion layer 10, the first interconnection layer 20, and a portion of the circuit chip 2000. More specifically, the second conductive pattern 85 may be electrically connected to the lower interconnection lines 55 in a second interconnection layer 50 of the circuit chip 2000. The second conductive pattern 85 may be formed of or include at least one of metallic materials (e.g., tungsten).

The second gapfill pattern 89 may be provided on the second conductive pattern 85 to fill the remaining region of the second penetration hole. The second gapfill pattern 89 may be provided to penetrate the photoelectric conversion layer 10 and the first interconnection layer 20. The second capping pattern 87 may be provided on the second gapfill pattern 89. The second capping pattern 87 may be formed of or include at least one of silicon-containing insulating materials (e.g., silicon oxide, silicon nitride, silicon oxynitride, and/or combinations thereof). The second protection layer 81 may be provided on the second conductive pattern 85 and the second capping pattern 87. The second protection layer 81 may cover the second conductive pattern 85 and the second capping pattern 87, but not the second contact plug 80.

The image sensor may include the circuit chip 2000. The circuit chip 2000 may be stacked on the sensor chip 1000. The circuit chip 2000 may include a second substrate 40 and a second interconnection layer 50. The second interconnection layer 50 may be interposed between the first interconnection layer 20 and the second substrate 40. Integrated circuits TR may be disposed on a top surface of the second substrate 40 or in the second substrate 40. The integrated circuits TR may include at least one of logic circuits, memory circuits, or combinations thereof. The integrated circuits TR may include, for example, transistors. The second interconnection layer 50 may include lower insulating layers and the lower interconnection lines 55. The lower interconnection lines 55 may be provided in the lower insulating layers. The lower interconnection lines 55 may be electrically connected to the integrated circuits TR.

FIGS. 11 to 20 are sectional views, which are taken along the line II-II' of FIG. 4 to illustrate a method of fabricating an image sensor, according to an embodiment of the inventive concept.

Figure 11:
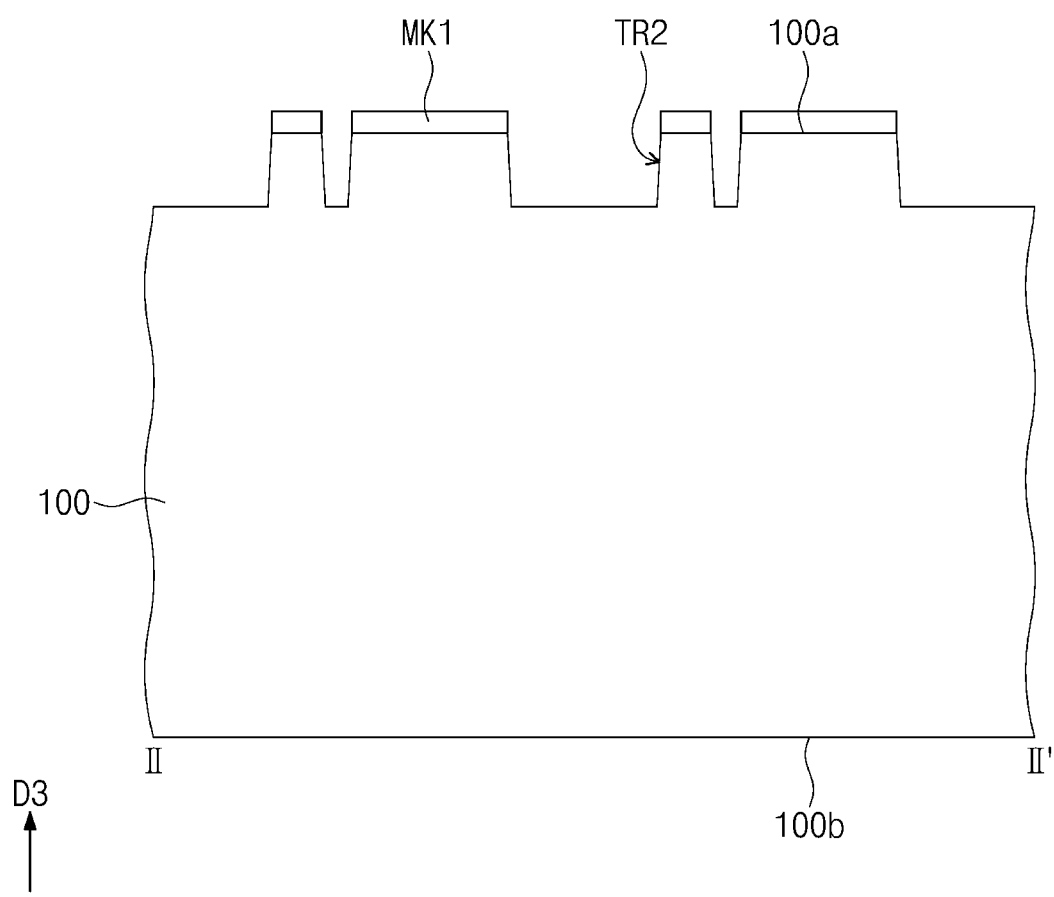
FIGS. 11 to 20 are sectional views, which are taken along the line II-IF of FIG. 4 to illustrate a method of fabricating an image sensor, according to an embodiment of the inventive concept.

Referring to FIG. 11, the first substrate 100 having the first surface 100a and the second surface 100b, which are opposite to each other, may be prepared. The first substrate 100 may be doped with impurities to have a first conductivity type (e.g., p-type). As an example, the first substrate 100 may be provided to have a bulk silicon wafer (e.g., of the first conductivity type) and an epitaxial layer (e.g., of the first conductivity type) formed on the bulk silicon wafer. As another example, the first substrate 100 may be a bulk substrate including a well of the first conductivity type.

The second trench TR2 may be formed on the first surface 100a of the first substrate 100. The formation of the second trench TR2 may include forming a first mask pattern MK on the first surface 100a of the first substrate 100 and performing an etching process using the first mask pattern MK on the first surface 100a.

Figure 12:
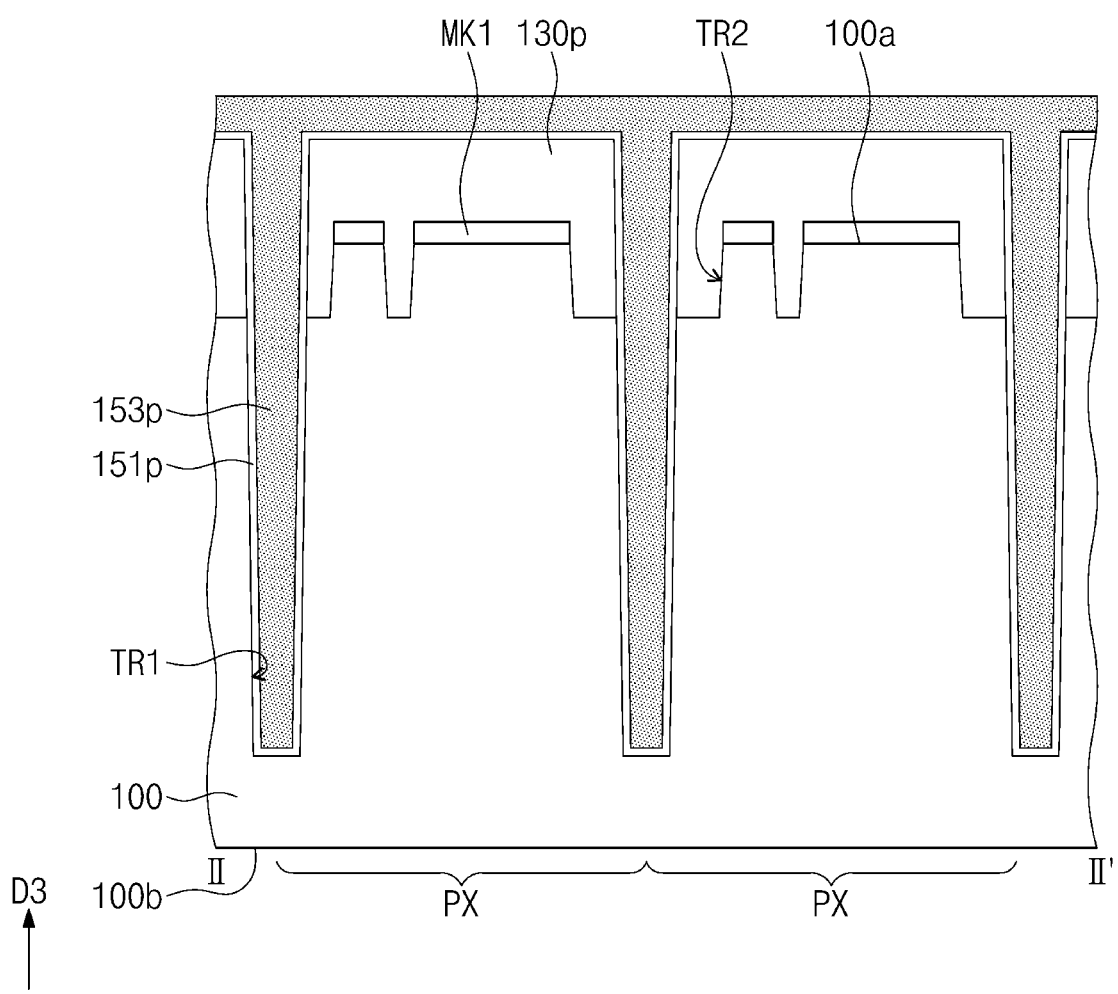

Referring to FIG. 12, a second preliminary device isolation pattern 130p may be formed on the first surface 100a of the first substrate 100. The second preliminary device isolation pattern 130p may be formed by performing a deposition process on the first surface 100a of the first substrate 100. The second preliminary device isolation pattern 130p may be formed of or include at least one of silicon oxide, silicon nitride, and/or silicon oxynitride. The second preliminary device isolation pattern 130p may be formed to fill an inner space of the second trench TR2 and to cover the first mask pattern MK. The second preliminary device isolation pattern 130p may be formed to have a top surface that is higher than the first surface 100a of the first substrate 100. The first trench TR1 may be formed by forming a mask (not shown) on the second preliminary device isolation pattern 130p and anisotropically etching the second preliminary device isolation pattern 130p and the first substrate 100. A bottom surface of the first trench TR1 may be located at a level higher than the second surface 100b of the first substrate 100.

After the formation of the first trench TR1, a first preliminary isolation pattern 151p may be formed to conformally cover an inner surface of the first trench TR1. The first preliminary isolation pattern 151p may be formed to cover an inner surface of the first trench TR1 and the top surface of the second preliminary device isolation pattern 130p. The first preliminary isolation pattern 151p may be formed by depositing an insulating material on the first substrate 100, in which the first trench TR1 is formed. The first preliminary isolation pattern 151p may be formed of or include at least one of silicon oxide, silicon nitride, and/or silicon oxynitride.

A second preliminary isolation pattern 153p may be formed on the first preliminary isolation pattern 151p. The second preliminary isolation pattern 153p may be formed by performing a deposition process on the first substrate 100 provided with the first preliminary isolation pattern 151p. The second preliminary isolation pattern 153p may be formed to cover the first preliminary isolation pattern 151p on the inner surface of the first trench TR1 and to cover the top surface of the second preliminary device isolation pattern 130p. The second preliminary isolation pattern 153p may be formed of or include, for example, poly silicon.

Figure 13:
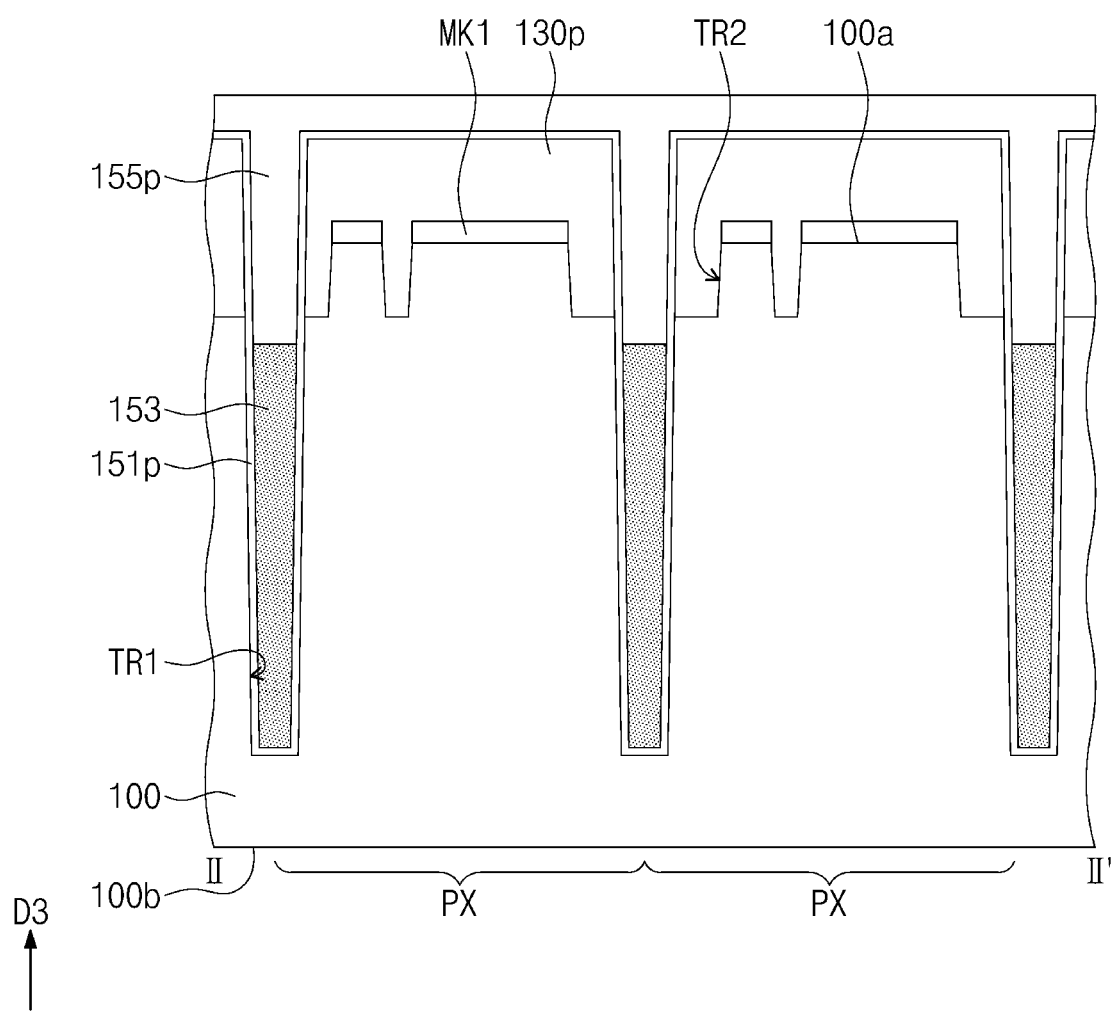

Referring to FIG. 13, an etching process may be performed on the second preliminary isolation pattern 153p. The second isolation pattern 153 may be formed by removing an upper portion of the second preliminary isolation pattern 153p through the etching process. Accordingly, a portion of the first preliminary isolation pattern 151p may be exposed to the outside. The etching process may be performed such that the second isolation pattern 153 is located at a level lower than the bottom surface of the second preliminary device isolation pattern 130p.

According to an embodiment, a doping process may be performed on the second isolation pattern 153, after the etching process. The doping process may be, for example, a beam-line ion implantation process or a plasma doping (PLAD) process. In the case of the plasma doping process, a source material in a gaseous state may be supplied into a process chamber. Then, the source material may be ionized to form a plasma, and the ionized source materials may be injected into the second isolation pattern 153 by applying a bias of high voltage to an electrostatic chuck (not shown), on which the first substrate 100 is located. By using the plasma doping process, it may be possible to realize a uniform doping profile even at a deep level and to reduce a process time for the doping process. In the case of the beam-line ion implantation process, it may be difficult to reduce a vertical variation in doping concentration of the second isolation pattern 153, because the first trench TR1 has a relatively small width and a relatively large depth. Accordingly, in the case where the doping process is performed using the beam-line ion implantation process, a concentration of impurities in the second isolation pattern 153 may vary depending on a vertical depth. According to an embodiment of the inventive concept, a dark current property of the image sensor may be improved by applying a negative voltage to the second isolation pattern 153.

A preliminary capping layer 155p may be formed on the first preliminary isolation pattern 151p and the second isolation pattern 153. The formation of the preliminary capping layer 155p may include performing a deposition process on the first surface 100a of the first substrate 100. The preliminary capping layer 155p may be formed of or include at least one of silicon oxide, silicon nitride, and/or silicon oxynitride.

Figure 14:
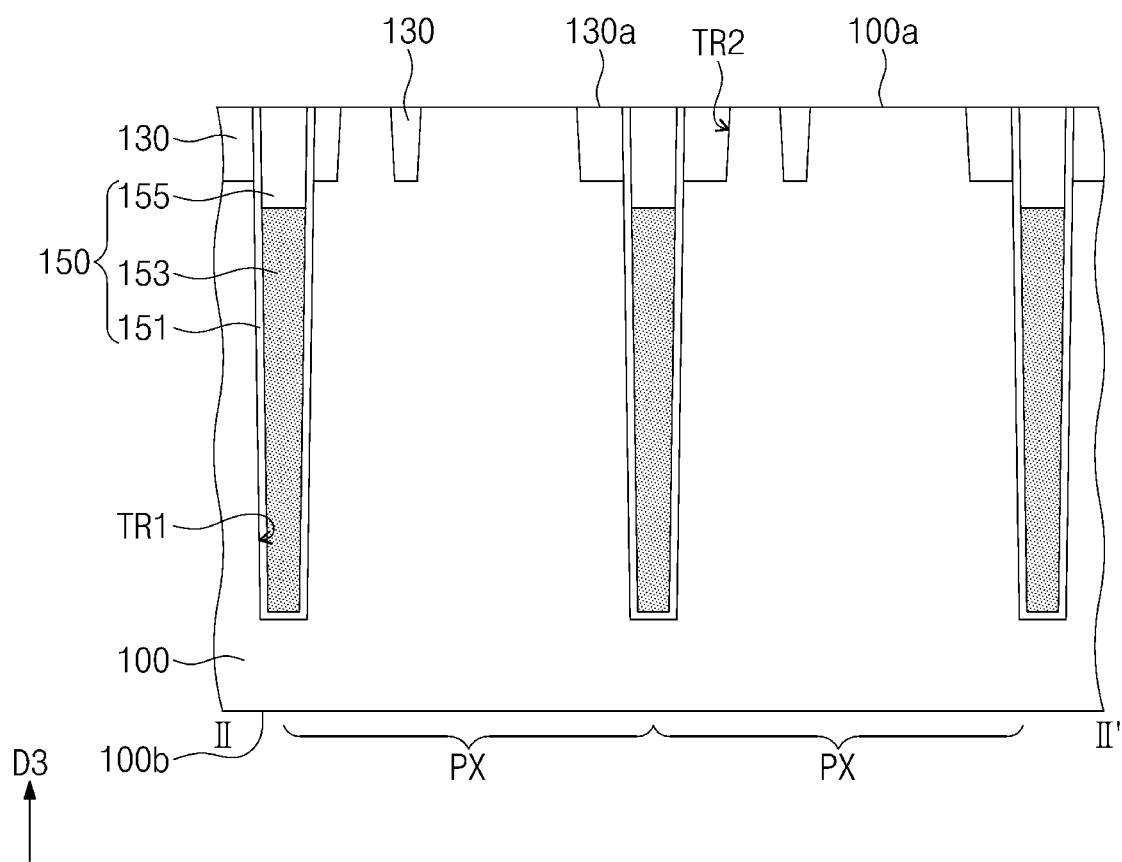

Referring to FIG. 14, the first isolation pattern 151, the capping pattern 155, and the device isolation pattern 130 may be formed. The formation of the capping pattern 155 and the device isolation pattern 130 may include performing a planarization process on the first surface 100a of the first substrate 100. An upper portion of the first preliminary isolation pattern 151p, an upper portion of the second preliminary device isolation pattern 130p, and an upper portion of the preliminary capping layer 155p may be removed by the planarization process. In an embodiment, the first mask pattern MK may be removed after the planarization process, and thus, it may be possible to prevent the first surface 100a of the first substrate 100 from being damaged. Accordingly, the first surface 100a of the first substrate 100, a top surface 130a of the device isolation pattern 130, the top surface of the capping pattern 155, and the top surface of the first isolation pattern 151 may be coplanar with each other.

Figure 15:
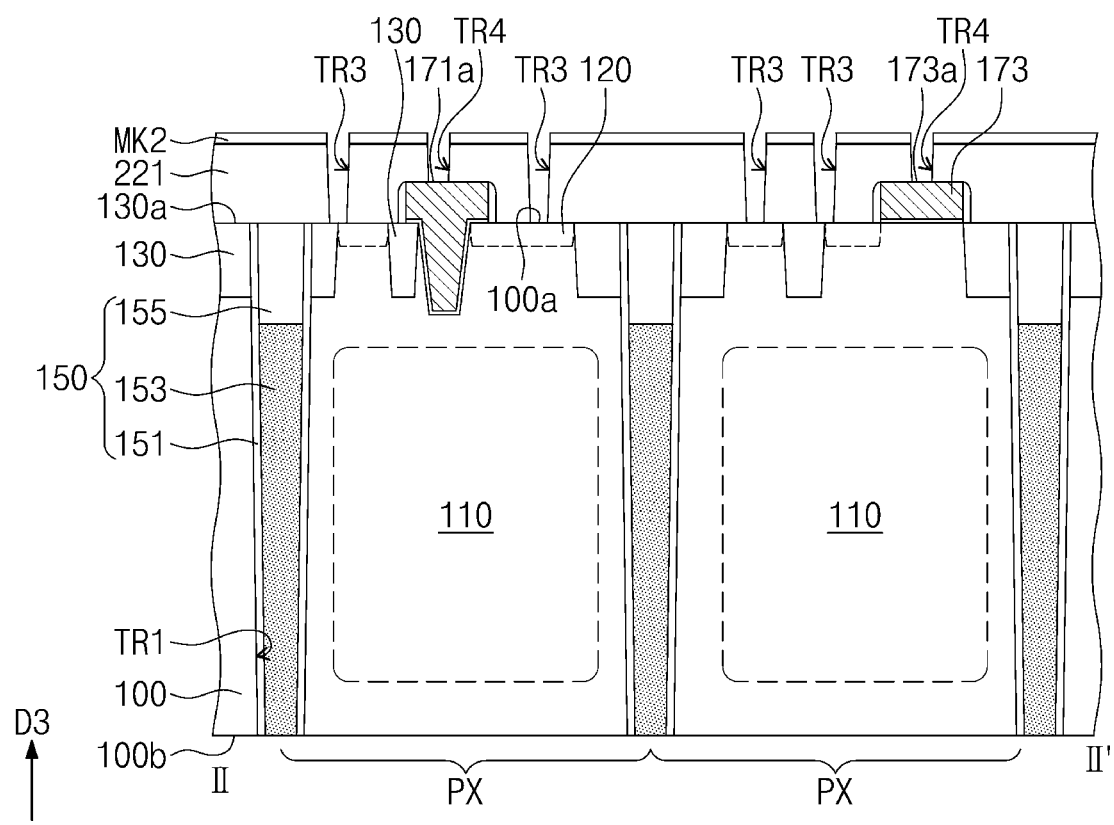

Referring to FIG. 15, the photoelectric conversion regions 110 may be formed by doping some portions of the unit pixel regions PX with impurities. The photoelectric conversion regions 110 may be doped to have a second conductivity type (e.g., n-type) that is different from the first conductivity type (e.g., p-type). A thinning process may be performed to remove a portion of the first substrate 100, and as a result, a vertical thickness of the first substrate 100 may be reduced. The thinning process may include grinding or polishing the second surface 100b of the first substrate 100 and anisotropically or isotropically etching the grinded or polished second surface 100b. The first substrate 100 may be inverted to perform the thinning process on the first substrate 100. A portion of the first substrate 100 may be removed by the grinding or polishing process, and surface defects may be removed from the first substrate 100 by the anisotropic or isotropic etching process.

As a result of the thinning process on the second surface 100b of the first substrate 100, the bottom surfaces of the first and second isolation patterns 151 and 153 may be exposed. The bottom surfaces of the first and second isolation patterns 151 and 153 may be coplanar with the second surface 100b of the first substrate 100. Thereafter, transistors may be formed on the first surface 100a of the first substrate 100. The formation of the transistors may include forming the gate patterns 171 and 173 and injecting impurities into the first substrate 100 through the first surface 100a to form the impurity regions 120. The impurity regions 120 may contain impurities of n- or p-type.

Referring further to FIG. 15, the first insulating layer 221 may be formed on the first surface 100a of the first substrate 100. The first insulating layer 221 may be formed to cover the gate patterns 171 and 173, the device isolation pattern 130, and the first surface 100a of the first substrate 100. The first insulating layer 221 may be formed by depositing an insulating material on the first surface 100a of the first substrate 100. The first insulating layer 221 may be formed of or include at least one of, for example, silicon oxide, silicon nitride, and/or silicon oxynitride.

A photolithography process may be performed on the top surface of the first insulating layer 221 to form a second mask MK2, which is used to form the third and fourth trenches TR3 and TR4. The second mask MK2 may define positions and shapes of the third and fourth trenches TR3 and TR4. A first etching process using the second mask MK2 as an etch mask may be performed on the first insulating layer 221. The second mask MK2 may be damaged during the first etching process, and in this case, a thickness of the second mask MK2 may be reduced. The first etching process may be, for example, a dry etching process and may be an anisotropic etching process. The third and fourth trenches TR3 and TR4 may be formed by removing a portion of the first insulating layer 221. The third trenches TR3 may be formed to expose the impurity regions 120 of the first substrate 100 and/or the top surface 130a of the device isolation pattern 130. More specifically, the third trenches TR3 may be formed on a boundary between the impurity region 120 of the first substrate 100 and the device isolation pattern 130 or on the impurity region 120 of the first substrate 100. The fourth trenches TR4 may be formed on the first gate pattern 171 and the second gate pattern 173. The fourth trenches TR4 may be formed to expose the top surface 171a of the first gate pattern 171 and the top surface 173a of the second gate pattern 173.

Figure 16:
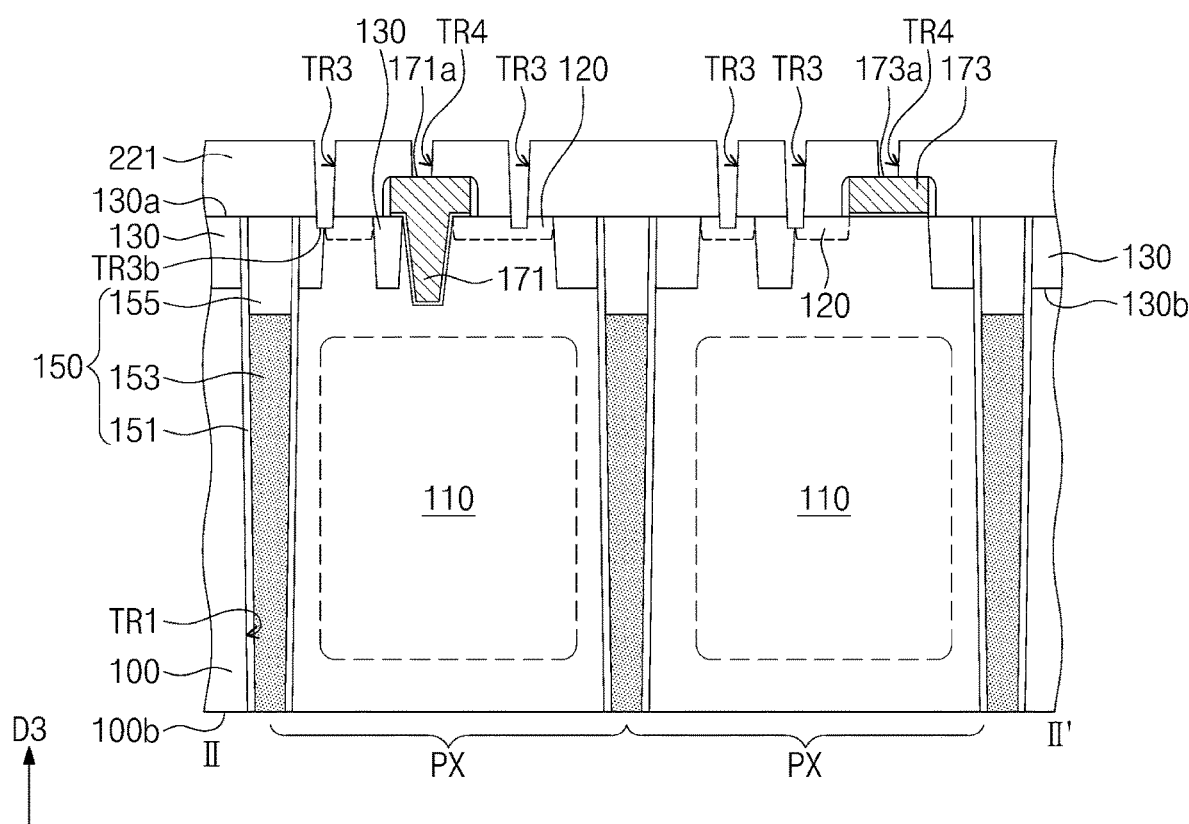

Referring to FIG. 16, a second etching process may be performed on the first substrate 100 and the device isolation pattern 130 exposed by the third trenches TR3. The second etching process may be performed using a remaining portion of the second mask MK2 and the first insulating layer 221 as an etch mask. A portion of the upper portion of the first substrate 100 and/or a portion of the upper portion of the device isolation pattern 130 may be removed during the second etching process. Here, by adjusting a composition of an etching gas, in which a plurality of source materials are mixed, it may be possible to simultaneously etch the first substrate 100 and the device isolation pattern 130 without a difference in etch rate between them. The depths of the third trenches TR3 may be increased by the second etching process. A bottom surface of each of the third trenches TR3 may be positioned at a level lower than the first surface 100a of the first substrate 100.

Figure 17:
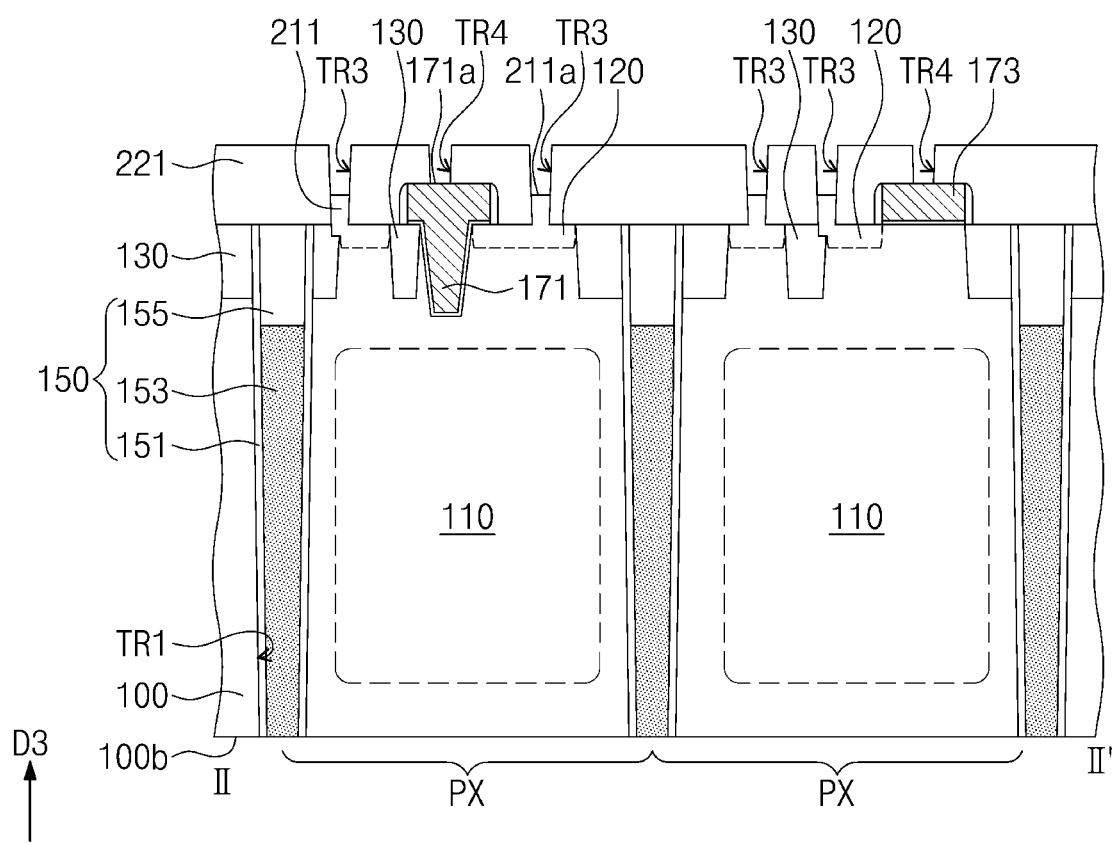

Referring to FIG. 17, the first patterns 211 of the first penetration structure may be formed to partially fill the inner spaces of the third and fourth trenches TR3 and TR4. For example, the formation of the first patterns 211 may include performing a deposition process to deposit a poly silicon layer on the first insulating layer 221 and performing an etching process to remove a portion of the deposited poly silicon layer.

In the case where the poly silicon layer is deposited on the first insulating layer 221, the poly silicon layer may be formed to cover the top surface of the first insulating layer 221 and to fill the inner spaces of the third and fourth trenches TR3 and TR4. The poly silicon layer may be connected to the impurity regions 120 of the first substrate 100, which is exposed by the third trenches TR3, and there may be no observable interface between the poly silicon layer and the impurity regions 120. The poly silicon layer may be in contact with at least a portion of the device isolation pattern 130, which is exposed by the third trenches TR3.

The etching process on the poly silicon layer may be performed to remove an upper portion of the poly silicon layer, and as a result, the first patterns 211 may be formed. The etching process may be performed until the top surfaces 211a of the first patterns 211 is lower than the top surface 171a of the first gate pattern 171 and the top surface 173a of the second gate pattern 173. Accordingly, the poly silicon layer may be removed from the entire inner spaces of the fourth trenches TR4, and the top surface 171a of the first gate pattern 171 and the top surface 173a of the second gate pattern 173 may be exposed. However, unlike that shown in the drawings, the etching process may be performed until the top surfaces 211a of the first patterns 211 is placed at a level higher than the top surface 171a of the first gate pattern 171 and the top surface 173a of the second gate pattern 173. In this case, as shown in FIG. 7, the second penetration structure 230 may further include the third pattern 231.

As another example, the formation of the first patterns 211 may include performing a selective epitaxial growth (SEG) process (hereinafter, an epi process) on the first substrate 100. For example, the first patterns 211 may be formed of a layer that is grown by the epi process, in which the first substrate 100 is used as a seed layer.

A thermal treatment process and an impurity injection process may be performed after the formation of the first patterns 211. As a result of the thermal treatment process, the first patterns 211 and the first substrate 100 may be connected to form a single object. For example, there may be no observable boundary between the first patterns 211 and the first substrate 100, but in an embodiment, the boundary between the first patterns 211 and the first substrate 100 may be observable. Impurities injected by the impurity injection process may have the same conductivity type as the impurities of the impurity region 120 connected to each of the first patterns 211.

Figure 18:
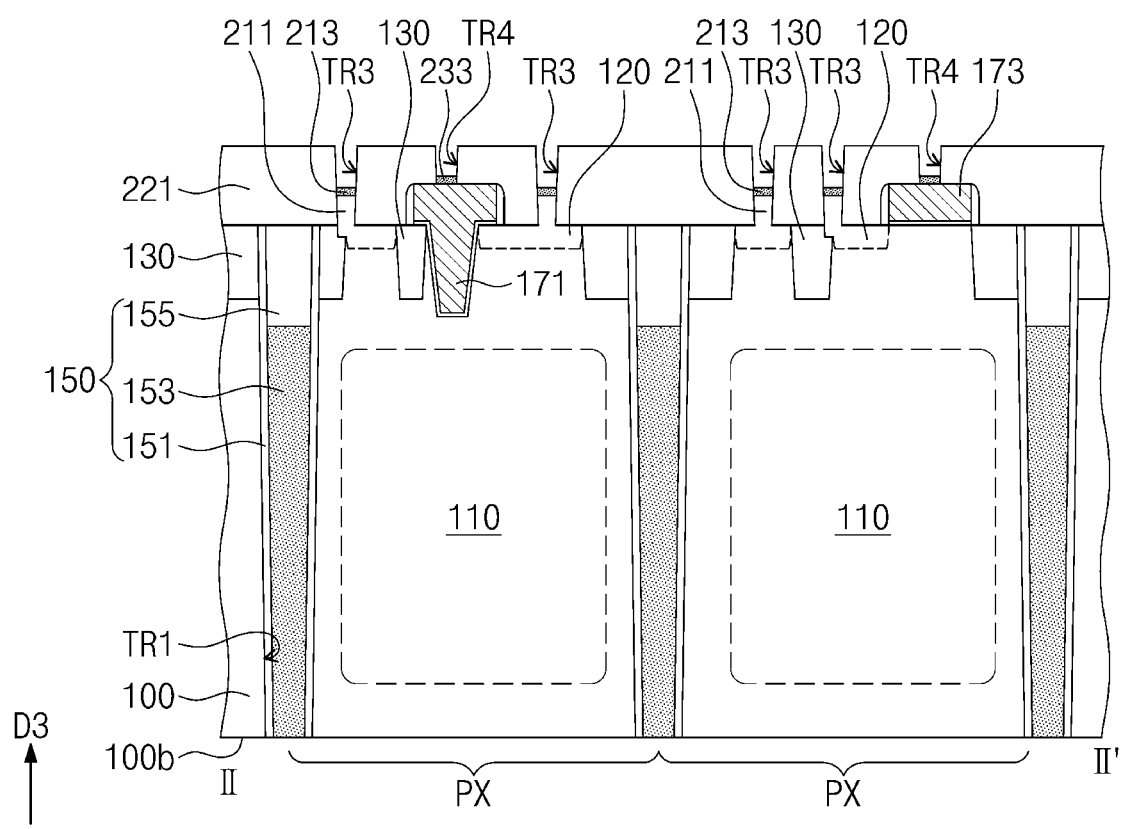

Referring to FIG. 18, the second patterns 213 of the first penetration structures and the first patterns 233 of the second penetration structures may be formed in the inner spaces of the third and fourth trenches TR3 and TR4. The formation of the second patterns 213 of the first penetration structure and the first patterns 233 of the second penetration structure may include depositing a metal silicide material to form a metal silicide layer and performing an etching process on the metal silicide layer.

The metal silicide layer may be formed by depositing the metal silicide material on the top surface of the first insulating layer 221 and in the third and fourth trenches TR3 and TR4. In an embodiment, the metal silicide material may include cobalt silicide (CoSix), nickel silicide (NiSix), titanium silicide (TiSix) and/or alloys thereof. The metal silicide layer may be formed to cover the top surface of the first insulating layer 221, the inner surfaces of the third trenches TR3, the top surfaces of the first patterns 211, the inner surfaces of the fourth trenches TR4, the top surface 171a of the first gate pattern 171, and the top surface of the second gate pattern 173. The metal silicide layer may be partially removed by performing an etching process on the metal silicide layer. The etching process may be performed until the second patterns 213 of the first penetration structures and the first patterns 233 of the second penetration structures have a thickness ranging from 50 Å to 200 Å.

Figure 19:
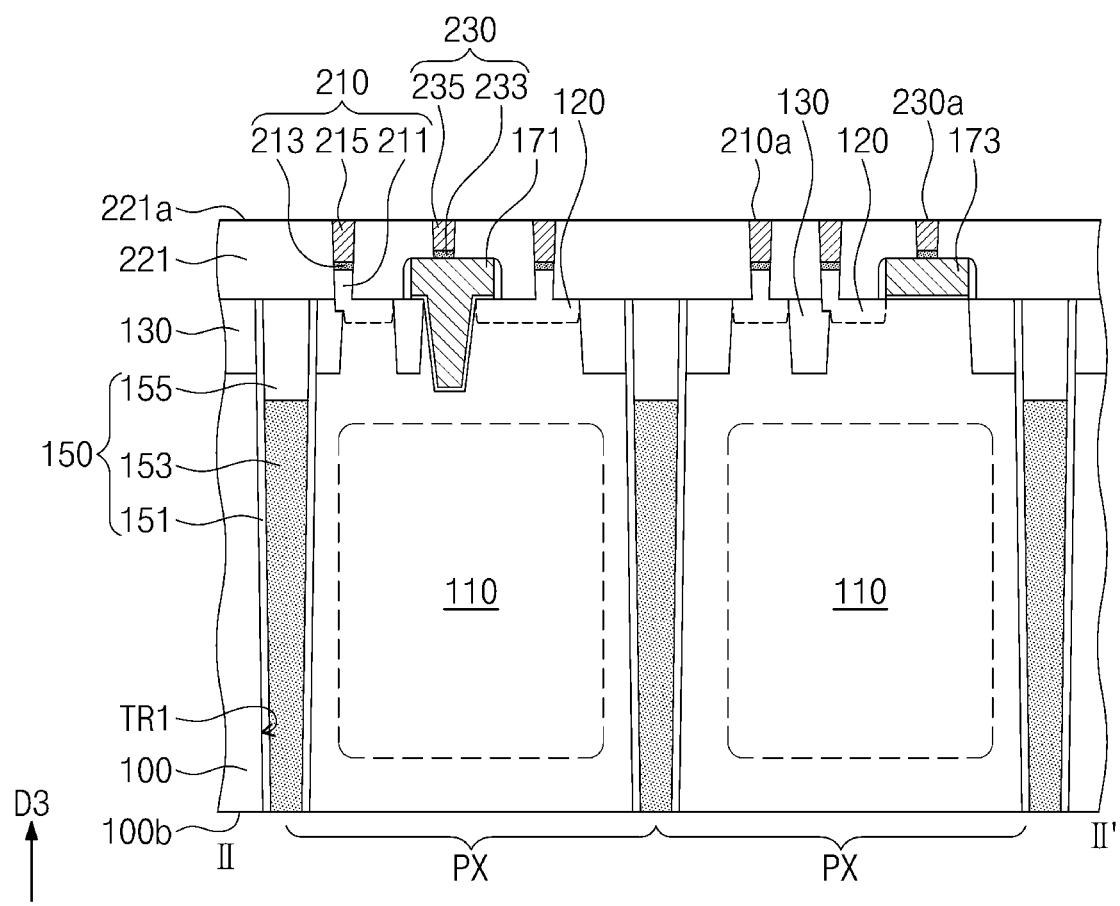

Referring to FIG. 19, the third patterns 215 of the first penetration structures and the second patterns 235 of the second penetration structures may be formed to fill the inner spaces of the third and fourth trenches TR3 and TR4. A polishing process may be performed on the top surface of the first insulating layer 221. As a result of the polishing process, the third patterns 215 and the second patterns 235 may have top surfaces that are coplanar with a top surface 221a of the first insulating layer 221. The second patterns 235 and the third patterns 215 may be formed of or include at least one of conductive materials (e.g., tungsten). Accordingly, the first penetration structure 210 including the first to third patterns 211, 213, and 215 and the second penetration structure 230 including the first and second patterns 233 and 235 may be formed.

Figure 20:
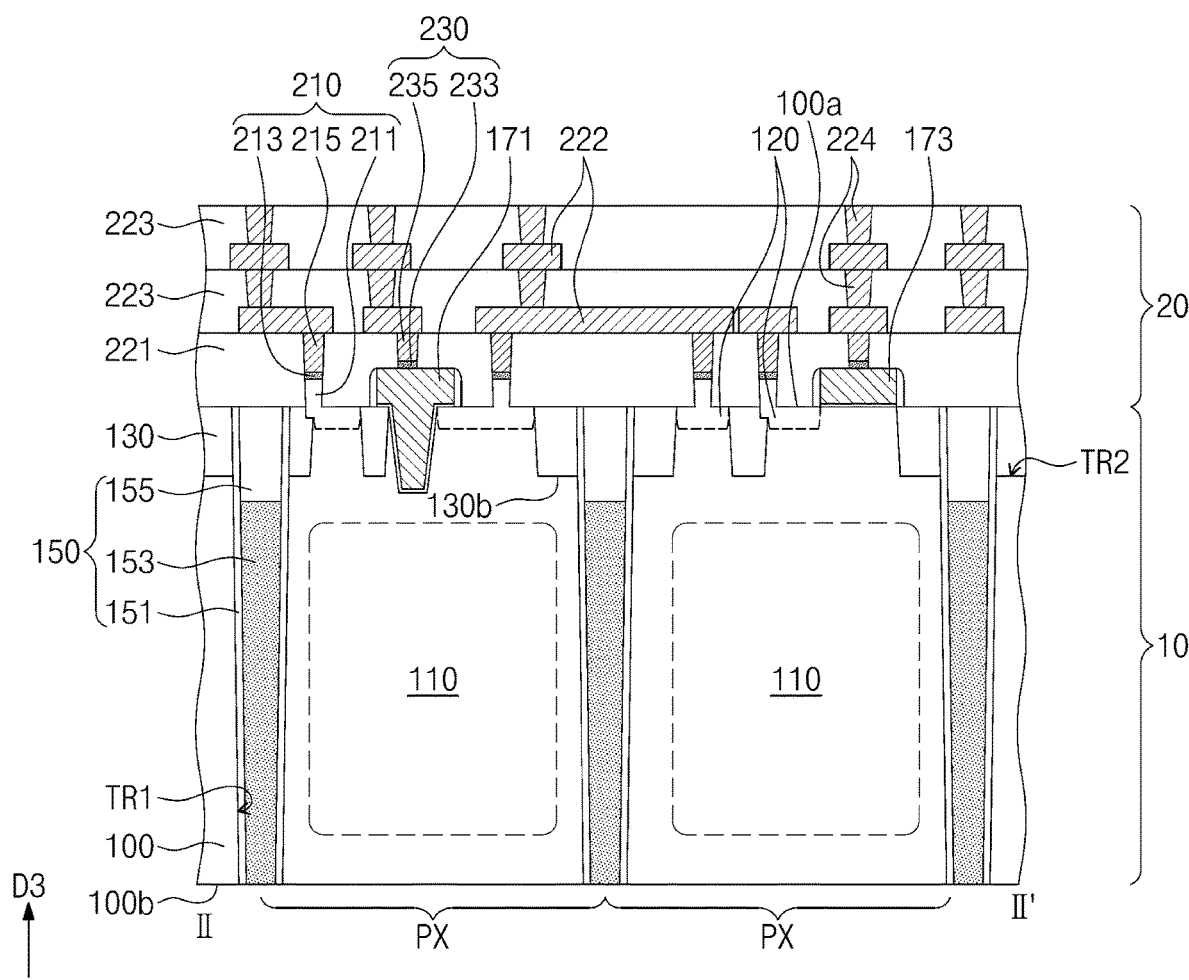

Referring to FIG. 20, the second insulating layers 223 may be sequentially formed on the top surfaces of the first insulating layer 221, the first penetration structure 210, and the second penetration structure 230. The interconnection lines 222 and the vias 224 may be formed in the second insulating layers 223. The interconnection lines 222 may be connected to the first penetration structure 210 and the second penetration structure 230, respectively.

Referring back to FIG. 5, the anti-reflection layer 311 and the first back-side insulating layer 313 may be formed on the second surface 100b of the first substrate 100. The grid pattern insulating layer 331 and the grid pattern 333 may be formed on the first back-side insulating layer 313. The grid pattern insulating layer 331 and the grid pattern 333 may be formed in a grid structure, when viewed in a plan view.

The color filters 320 may be formed on the first back-side insulating layer 313. The color filters 320 may be formed on the unit pixel regions PX, respectively. The micro lenses 340 may be formed on the color filters 320, respectively. Accordingly, an image sensor according to an embodiment of the inventive concept may be fabricated.

According to an embodiment of the inventive concept, an image sensor may include a penetration structure including first to third patterns formed of different materials. The penetration structure may be provided to be spaced apart from gate patterns and to be vertically overlapped with both of a device isolation pattern and a substrate adjacent thereto. Accordingly, the gate pattern may be designed to have an increased size, and this may make it possible to realize an image sensor with improved electric characteristics.

While example embodiments of the inventive concept have been particularly shown and described, it will be understood by one of ordinary skill in the art that variations in form and detail may be made therein without departing from the spirit and scope of the attached claims.

What is claimed is:

1. An image sensor, comprising:
 a first substrate having a first surface and a second surface, which are opposite to each other, the first substrate comprising unit pixel regions and impurity regions, the impurity regions being adjacent to the first surface,
 a device isolation pattern provided on the first surface of the first substrate to define the impurity regions; and
 a first interconnection layer covering the first surface of the first substrate, the first interconnection layer comprising a first insulating layer covering the first surface of the first substrate, interconnection lines on the first insulating layer, and a first penetration structure penetrating the first insulating layer,
 wherein the first penetration structure comprises:
 a first pattern, which is connected to one of the impurity regions of the first substrate and is in contact with at least a portion of the device isolation pattern;
 a second pattern, which is provided on the first pattern and is in contact with the interconnection lines; and
 a third pattern provided between the first pattern and the second pattern,
 wherein a top surface of the first pattern is provided at a level higher than a top surface of the device isolation pattern,
 wherein a first side surface and a bottom surface of the first pattern is in physical contact with the device isolation pattern, and
 wherein a second side surface and the bottom surface of the first pattern is in physical contact with the impurity region.

2. The image sensor of claim 1, wherein the third pattern comprises a metal silicide material.

3. The image sensor of claim 1, wherein the first pattern of the first penetration structure is overlapped, in a direction perpendicular to the first substrate, with both the device isolation pattern and one of the impurity regions of the first substrate.

4. The image sensor of claim 1, further comprising a first gate pattern, which is provided on the first surface of the first substrate and adjacent to the first penetration structure,
 wherein the top surface of the first pattern of the first penetration structure is provided at a level between the first surface of the first substrate and a top surface of the first gate pattern.

5. The image sensor of claim 1, further comprising a first gate pattern, which is provided on the first surface of the first substrate and adjacent to the first penetration structure,
 wherein the top surface of the first pattern of the first penetration structure is provided at a level higher than a top surface of the first gate pattern.

6. The image sensor of claim 1, wherein a bottom surface of the first pattern of the first penetration structure is provided at a level between the top surface of the device isolation pattern and a bottom surface of the device isolation pattern.

7. The image sensor of claim 1, wherein a vertical distance from the top surface of the device isolation pattern to the top surface of the first pattern of the first penetration structure has a value from 100 Å to 1800 Å.

8. The image sensor of claim 1, further comprising:
 a first gate pattern, which is provided on the first surface of the first substrate and adjacent to the first penetration structure, and a second penetration structure, which is provided to penetrate the first insulating layer,
wherein the second penetration structure comprises:
a first pattern in contact with a top surface of the first gate pattern; and
a second pattern provided on the first pattern of the second penetration structure and in contact with the interconnection lines, and
wherein the first pattern of the second penetration structure comprises a metal silicide material.

9. The image sensor of claim 8, wherein the third pattern of the first penetration structure and the first pattern of the second penetration structure are disposed at different levels.

10. The image sensor of claim 8, wherein the first penetration structure is one of a plurality of first penetration structures,
the second penetration structure is disposed between two of the plurality of the first penetration structures, and
the top surfaces of the first penetration structures and the top surface of the second penetration structure are disposed at the same level, with respect to the first surface of the first substrate.

11. The image sensor of claim 1, wherein the second pattern of the first penetration structure and the interconnection lines comprise different materials.

12. An image sensor, comprising:
a first substrate having a first surface and a second surface, which are opposite to each other, the first substrate comprising unit pixel regions and impurity regions, the impurity regions being adjacent to the first surface,
a device isolation pattern provided on the first surface of the first substrate to define the impurity regions; and
a first interconnection layer covering the first surface of the first substrate, the first interconnection layer comprising a first insulating layer covering the first surface of the first substrate, interconnection lines on the first insulating layer, and a first penetration structure penetrating the first insulating layer,
wherein the first penetration structure comprises:
a first pattern, which is connected to one of the impurity regions of the first substrate and is vertically overlapped, in a direction perpendicular to the first substrate, with at least a portion of the device isolation pattern;
a second pattern in contact with the interconnection lines; and
a third pattern covering a top surface of the first pattern,
wherein the first pattern and the second pattern are vertically spaced apart from each other, with the third pattern interposed therebetween,
wherein a first side surface and a bottom surface of the first pattern is in physical contact with the device isolation pattern, and
wherein a second side surface and the bottom surface of the first pattern is in physical contact with the impurity region.

13. The image sensor of claim 12, wherein the third pattern is provided at a level between a top surface of the device isolation pattern and the interconnection lines.

14. The image sensor of claim 12, wherein the first pattern of the first penetration structure comprises poly silicon doped with impurities.

15. The image sensor of claim 12, further comprising a first gate pattern, which is provided on the first surface of the first substrate and adjacent to the first penetration structure, and wherein a top surface of the first pattern of the first penetration structure is provided at a level between a top surface of the first gate pattern and a bottom surface of a lowermost one of the interconnection lines.

16. The image sensor of claim 12, wherein the first pattern, the second pattern, and the third pattern are vertically aligned with each other, and
the first pattern, the second pattern, and the third pattern comprise different materials.

17. The image sensor of claim 12, further comprising:
a first gate pattern, which is provided on the first surface of the first substrate and adjacent to the first penetration structure; and
a second penetration structure penetrating the first insulating layer,
wherein the second penetration structure comprises a first pattern in contact with a top surface of the first gate pattern, a second pattern in contact with the interconnection lines, and a third pattern provided between the first pattern and the second pattern, and
the first pattern comprises poly silicon doped with impurities.

18. The image sensor of claim 17, wherein the third pattern of the first penetration structure and the third pattern of the second penetration structure are disposed at the same level.

19. An image sensor, comprising:
a first substrate having a first surface and a second surface, which are opposite to each other, the first substrate comprising a pixel array region, an optical black region, and a pad region, the pixel array region comprising unit pixel regions and impurity regions, the impurity regions being adjacent to the first surface,
a device isolation pattern provided on the first surface of the first substrate to define the impurity regions;
a pixel isolation pattern provided in the first substrate to define the unit pixel regions;
gate patterns provided on the first surface of the first substrate;
an anti-reflection layer provided on the second surface of the first substrate;
color filters and micro lenses provided on the anti-reflection layer;
a grid pattern provided between the color filters; and
a first interconnection layer covering the first surface of the first substrate and the gate patterns, the first interconnection layer comprising a first insulating layer covering the first surface of the first substrate, interconnection lines on the first insulating layer, and a first penetration structure and a second penetration structure penetrating the first insulating layer,
wherein the first penetration structure comprises:
a first pattern connected to one of the impurity regions of the first substrate and in contact with at least a portion of the device isolation pattern;
a second pattern provided on the first pattern and in contact with the interconnection lines; and
a third pattern provided between the first pattern and the second pattern,
wherein a top surface of the first pattern is provided at a level higher than a top surface of the device isolation pattern,
wherein a first side surface and a bottom surface of the first pattern is in physical contact with the device isolation pattern, and wherein a second side surface and the bottom surface of the first pattern is in physical contact with the impurity region.

20. The image sensor of claim 19, further comprising:
a light-blocking pattern provided on the optical black region of the first substrate and on the first surface of the first substrate; and
outer connection terminals provided on the pad region of the first substrate and adjacent to the first surface of the first substrate.

* * * * *